(12) United States Patent
Chung et al.

(10) Patent No.: US 10,763,156 B2
(45) Date of Patent: Sep. 1, 2020

(54) INTEGRATED CIRCUIT DEVICE

(71) Applicant: Samsung Electronics Co., Ltd., Suwon-si, Gyeonggi-do (KR)

(72) Inventors: Jae-yup Chung, Yongin-si (KR); Il-ryong Kim, Seongnam-si (KR); Ju-youn Kim, Suwon-si (KR); Jin-wook Kim, Hwaseong-si (KR); Kyoung-hwan Yeo, Seoul (KR); Yong-gi Jeong, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 33 days.

(21) Appl. No.: 16/165,294

(22) Filed: Oct. 19, 2018

(65) Prior Publication Data

US 2019/0326158 A1     Oct. 24, 2019

(30) Foreign Application Priority Data

Apr. 20, 2018 (KR) .................. 10-2018-0046287

(51) Int. Cl.
  *H01L 29/66* (2006.01)
  *H01L 21/762* (2006.01)
  *H01L 27/092* (2006.01)
  *H01L 27/088* (2006.01)

(52) U.S. Cl.
  CPC .... *H01L 21/76232* (2013.01); *H01L 27/0886* (2013.01); *H01L 27/0924* (2013.01); *H01L 29/66545* (2013.01); *H01L 29/66795* (2013.01)

(58) Field of Classification Search
  CPC ........... H01L 21/76232; H01L 27/0924; H01L 29/66545; H01L 29/66795; H01L 27/0886; H01L 21/823431; H01L 29/66818; H01L 29/7854; H01L 29/7846; H01L 29/78; H01L 29/0642
  See application file for complete search history.

(56) References Cited

U.S. PATENT DOCUMENTS

| | | | |
|---|---|---|---|
| 9,190,407 B2 | 11/2015 | Kwon et al. | |
| 9,263,340 B2 | 2/2016 | Taylor, Jr. et al. | |
| 9,379,106 B2 | 6/2016 | Hong et al. | |
| 9,673,300 B2 | 6/2017 | Ha et al. | |
| 10,262,870 B2* | 4/2019 | Chen ..................... | H01L 29/785 |
| 2016/0284706 A1 | 9/2016 | Chung et al. | |
| 2016/0336234 A1 | 11/2016 | Kim et al. | |
| 2017/0062475 A1 | 3/2017 | Song et al. | |

* cited by examiner

*Primary Examiner* — David Vu
(74) *Attorney, Agent, or Firm* — Harness, Dickey & Pierce, P.L.C.

(57) ABSTRACT

An integrated circuit device includes a substrate having a first region and a second region, a first fin-isolation insulating portion in each of the first region and the second region and having a first width in a first direction, a pair of fin-type active regions spaced apart from each other in each of the first region and the second region with the first fin-isolation insulating portion therebetween, and extending in a straight line in the first direction, a pair of second fin-isolation insulating portions contacting, in each of the first region and the second region, two side walls of the first fin-isolation insulating portion, respectively, each of the two side walls facing the opposite sides in the first direction, and a plurality of gate structures extending in the second direction and comprising a plurality of dummy gate structures.

20 Claims, 61 Drawing Sheets

X1 – X1'

X1 - X1'

X1 – X1'

X1 – X1'

X1 - X1'

X1 – X1'

X1 – X1'

X1 – X1'

X1 – X1'

X1 – X1'

# INTEGRATED CIRCUIT DEVICE

CROSS-REFERENCE TO RELATED APPLICATION

This application claims the benefit of Korean Patent Application No. 10-2018-0046287, filed on Apr. 20, 2018, in the Korean Intellectual Property Office, the disclosure of which is incorporated herein in its entirety by reference.

BACKGROUND

The inventive concepts relate to an integrated circuit device, and more particularly, to an integrated circuit device including a fin-type active region.

With developments in electronic technologies, integrated circuit devices have been down-scaled, and for the highly integrated circuit devices, not only a higher operational speed, but also higher operational accuracy are needed. Thus, it is required to develop an integrated circuit device and a method of realizing the integrated circuit device, which has a structure for reducing an area occupied by wires and contacts in a relatively small area of the integrated circuit device, and at the same time for stably obtaining an insulation distance between the wires and the contacts.

SUMMARY

The inventive concepts provide an integrated circuit device having a structure in which transistors are capable of providing improved or optimum performance, even when an area of an element region is reduced due to down-scaling of the integrated circuit device.

According to an aspect of the inventive concepts, there is provided an integrated circuit device including a substrate having an element region, a first fin-isolation insulating portion on the element region, the first fin-isolation insulating portion having two sidewalls and having a first width in a first direction, one or more second fin-isolation insulating portions adjacent to at least one of the two side walls of the first fin-isolation insulating portion, each of the two side walls facing the opposite side in the first direction, the one or more second fin-isolation insulating portions extending in a second direction crossing the first direction and having a second width that is less than the first width in the first direction, a pair of fin-type active regions spaced apart from each other in the element region with the first fin-isolation insulating portion and the one or more second fin-isolation insulating portions therebetween, and extending in a straight line in the first direction, and a plurality of gate structures extending in the second direction and including a plurality of dummy gate structures, wherein a pair of dummy gate structures from among the plurality of dummy gate structures extend in a straight line in the second direction with the one or more second fin-isolation insulating portions therebetween, and a vertical level of an uppermost surface of the plurality of fin-type active regions is higher than a vertical level of an uppermost surface of the first fin-isolation insulating portion and lower than a vertical level of an uppermost surface of the one or more second fin-isolation insulating portions.

According to another aspect of the inventive concepts, there is provided an integrated circuit device including a substrate having a first region and a second region, a first fin-isolation insulating portion in each of the first region and the second region and having a first width in a first direction, a pair of fin-type active regions spaced apart from each other in each of the first region and the second region with the first fin-isolation insulating portion therebetween, and extending in a straight line in the first direction, one or more second fin-isolation insulating portions vertically overlapping a portion of the first fin-isolation insulating portion in at least one of the first region and the second region, extending in a second direction crossing the first direction, and having a second width that is less than the first width in the first direction, and a plurality of gate structures extending in the second direction and including a plurality of dummy gate structures, wherein a pair of dummy gate structures from among the plurality of dummy gate structures extend in a straight line in the second direction with one second fin-isolation insulating portion therebetween, and one or more dummy gate structures from among the plurality of dummy gate structures, except the pair of dummy gate structures, vertically overlap a portion of the first fin-isolation insulating portion in the second region.

According to another aspect of the inventive concepts, there is provided an integrated circuit device including a substrate having a first region and a second region, a first fin-isolation insulating portion in each of the first region and the second region and having a first width in a first direction, a pair of fin-type active regions spaced apart from each other in each of the first region and the second region with the first fin-isolation insulating portion therebetween, and extending in a straight line in the first direction, a pair of second fin-isolation insulating portions contacting, in each of the first region and the second region, the two side walls of the first fin-isolation insulating portion, respectively, each of the two side walls facing the opposite sides in the first direction, and a plurality of gate structures extending in a second direction and including a plurality of dummy gate structures, wherein at least a portion of the pair of second fin-isolation insulating portions in the first region and at least a portion of the pair of second fin-isolation insulating portions in the second region have a different material from each other.

BRIEF DESCRIPTION OF THE DRAWINGS

Embodiments of the inventive concepts will be more clearly understood from the following detailed description taken in conjunction with the accompanying drawings in which:

FIGS. 3A, 3B, and 3C through FIGS. 16A, 16B, and 16C are cross-sectional views for describing a method of manufacturing an integrated circuit device, according to embodiments, the cross-sectional views being illustrated in a sequential order of the method;

DETAILED DESCRIPTION OF EMBODIMENTS

Figure 1:
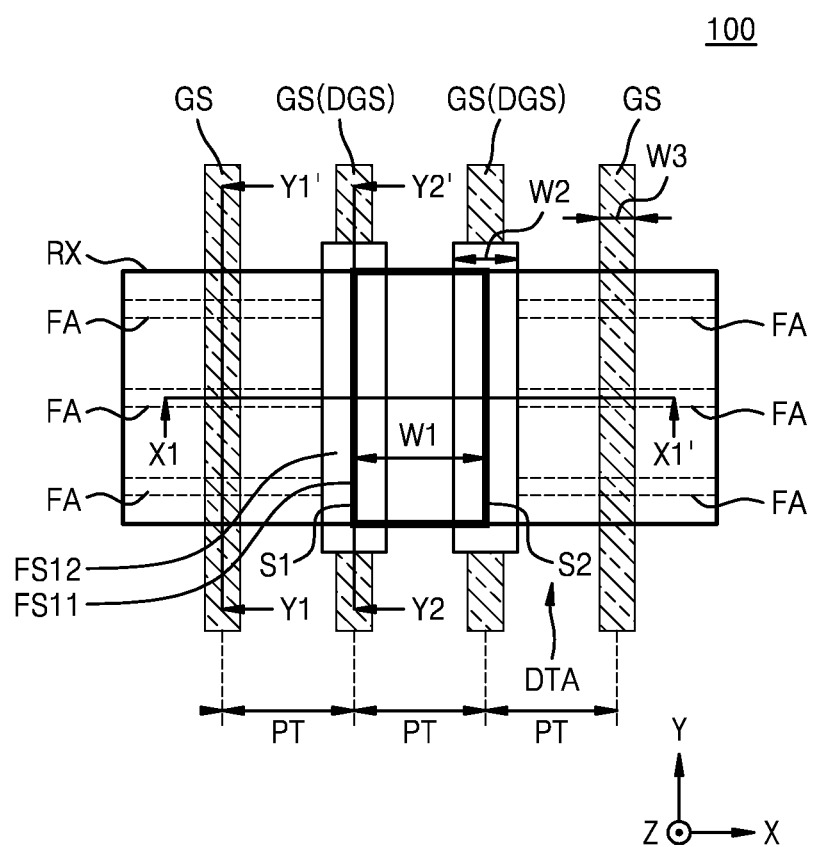
FIG. 1 is a planar layout diagram for describing an integrated circuit device according to embodiments.
Figure 2A:
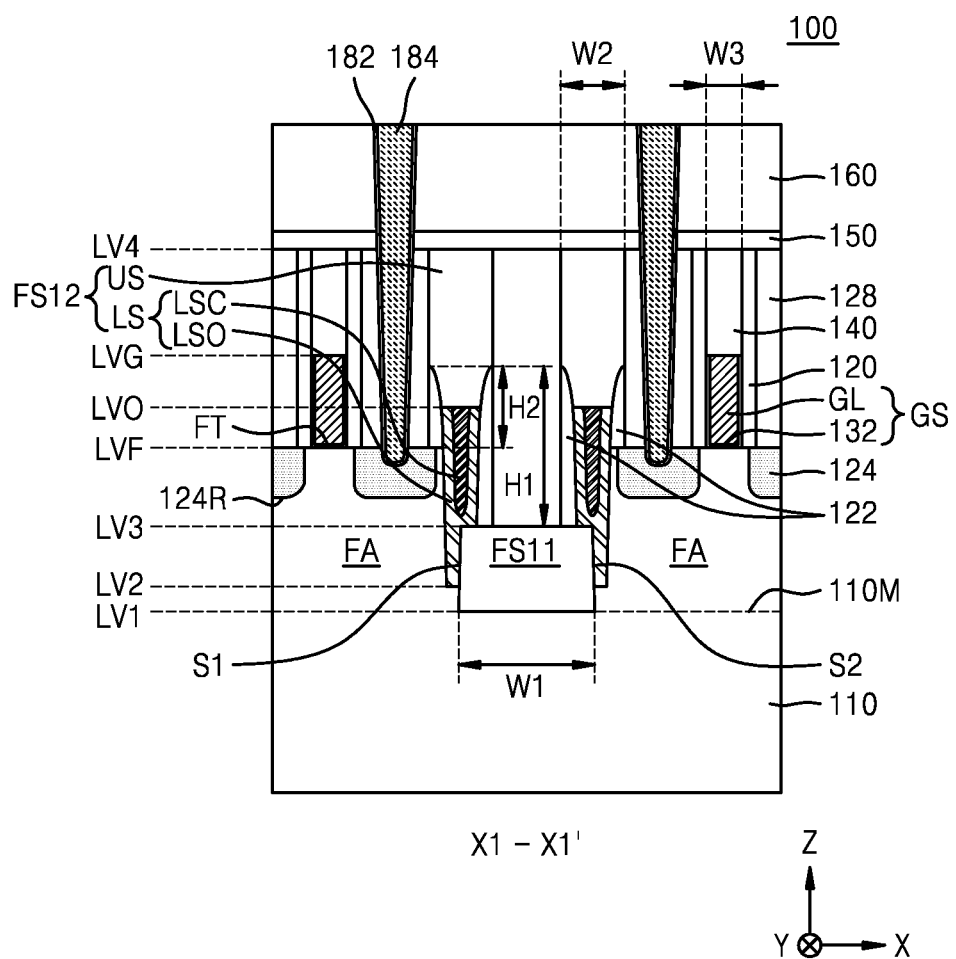
FIG. 2A is a cross-sectional view for describing an integrated circuit device according to an embodiment.

FIG. 1 is a planar layout diagram for describing an integrated circuit device 100 according to embodiments, and FIG. 2A is a cross-sectional view for describing the integrated circuit device 100 according to an embodiment. In detail, FIG. 2A is an example cross-sectional view taken along a line X1-X1' of FIG. 1.

Referring to FIGS. 1 and 2A together, the integrated circuit device 100 may include a fin field-effect transistor (FinFET) device. The FinFET device may include a logic cell. The logic cell may be variously formed by including a plurality of circuit elements, such as transistors, registers, etc. The logic cell may include, for example, AND, NAND, OR, NOR, exclusive OR (XOR), exclusive NOR (XNOR), an inverter (INV), an adder (ADD), a buffer (BUF), delay (DLY), a filter (FIL), a multiplexer (MXT/MXIT), or/and/inverter (OAI), and/or (AO), and/or/inverter (AOI), a D flip-flop, a reset flip-flop, a master-slave flip-flop, a latch, etc., and the logic cell may include standard cells performing desired logic functions, such as a counter, a buffer, etc.

The integrated circuit device 100 may include a substrate 110 having an element region RX, and a plurality of fin-type active regions FA protruding from the substrate 110 in the element region RX. The substrate 110 may have a circumferential surface 110M extending at a vertical level LV1 in a horizontal direction (an X-Y plane direction). The substrate 110 may include a semiconductor, such as Si or Ge, or a compound semiconductor, such as SiGe, SiC, GaAs, InAs, or InP. The substrate 110 may include a conductive region. For example, the substrate 110 may include a well doped with impurities or a structure doped with impurities.

A deep trench (refer to DT of FIG. 3B) may be formed in the substrate 110 around the element region RX, and an element-isolation region DTA may be formed on the deep trench DT.

The plurality of fin-type active regions FA may extend in parallel to each other in a first direction (direction X). As illustrated in FIG. 3B, an element-isolation layer 112 (refer to FIG. 3B) may be formed on the substrate 110 in an area between the plurality of fin-type active regions FA, and in the element-isolation region DTA. The plurality of fin-type active regions FA may protrude above the element-isolation layer 112 in a fin shape in the element region RX.

The element-isolation layer 112 may include, for example, a silicon oxide layer. However, the inventive concepts are not limited thereto. In some embodiments, the element-isolation layer 112 may include a first insulating liner, a second insulating liner, and a buried insulating layer that are sequentially stacked on the substrate 110.

A first fin-isolation insulating portion FS11 may be disposed in the element region RX. In some embodiments, the first fin-isolation insulating portion FS11 may be a portion of the element-isolation layer 112. The first fin-isolation insulating portion FS11 may have a first width W1 in the first direction (the direction X).

In some embodiments, the element-isolation layer 112, the element-isolation region DTA, and the first fin-isolation insulating portion FS11 may include the same insulating material. For example, each of the element-isolation layer 112, the element-isolation region DTA, and the first fin-isolation insulating portion FS11 may include a silicon oxide layer. However, the inventive concepts are not limited thereto.

In the element region RX, the plurality of fin-type active regions FA may be spaced apart from each other with the first fin-isolation insulating portion FS11 therebetween and may include a pair of fin-type active regions FA extending in a straight line in the first direction (the direction X).

A plurality of gate structures GS may extend on the substrate 110 in a second direction (direction Y) crossing the plurality of fin-type active regions FA. The plurality of gate structures GS may have the same width in the first direction (the direction X) and may be disposed at a constant pitch PT in the first direction (the direction X). Each of the plurality of gate structures GS may include a stack of a gate insulating layer 132 and a gate line GL. The gate insulating layer 132 may cover a bottom surface and both side walls of the gate line GL.

The plurality of gate structures GS may extend to cover a top surface and both side walls of each of the plurality of fin-type active regions FA and a top surface of the element-isolation layer 112. A plurality of metal-oxide-semiconductor (MOS) transistors may be formed in the element region RX along the plurality of gate structures GS. Each of the plurality of MOS transistors may be a three-dimensional (3D) MOS transistor having channels at the top surfaces and the both side walls of the plurality of fin-type active regions FA.

Some of the plurality of gate structures GS may be a plurality of dummy gate structure DGS, and the others of the plurality of gate structures GS may be normal gate structures. The plurality of dummy gate structures DGS may include a stack of the gate insulating layer 132 and the gate line GL. However, the dummy gate structures DGS may maintain an electric floating state during an operation of the integrated circuit device 100. In some embodiments, the dummy gate structures DGS may be omitted.

The plurality of gate insulating layers 132 may include a silicon oxide layer, a high-dielectric layer, or a combination thereof. The high-dielectric layer may include a material having a higher dielectric constant than a material of a silicon oxide layer. The high-dielectric layer may include a metal oxide or a metal oxynitride. An interface layer may be between the fin-type active regions FA and the gate insulating layer 132. The interface layer may include an oxide layer, a nitride layer, or an oxynitride layer.

The plurality of gate lines GL may have a structure of a metal nitride layer, a metal layer, a conductive capping layer, and a gap-fill metal layer that are sequentially stacked. The metal nitride layer and the metal layer may include at least one metal selected from Ti, Ta, W, Ru, Nb, Mo, and Hf. The gap-fill metal layer may include a W layer or an Al layer. Each of the plurality of gate lines GL may include a work-function metal-containing layer. The work-function metal-containing layer may include at least one metal selected from Ti, W, Ru, Nb, Mo, Hf, Ni, Co, Pt, Yb, Tb, Dy, Er, and Pd. In some embodiments, each of the plurality of gate lines GL may include a stack of TiAlC/TiN/W, a stack of TiN/TaN/TiAlC/TiN/W, or a stack of TiN/TaN/TiN/TiAlC/TiN/W, but is not limited thereto.

A top surface of each of the plurality of gate structures GS may be covered by a gate insulating capping layer 140. The plurality of gate insulating capping layers 140 may include a silicon nitride layer.

A plurality of second fin-isolation insulating portions FS12 may extend on the substrate 110 in parallel to one another in the second direction (the direction Y). A pair of second fin-isolation insulating portions FS12 spaced apart from each other may be disposed between a pair of gate structures GS, in the element region RX. The plurality of second fin-isolation insulating portions FS12 may extend long in the second direction (the direction Y). Each of the plurality of second fin-isolation insulating portions FS12 may have a second width W2 that is less than the first width W1 in the first direction (the direction X). The second width W2 in the first direction (the direction X) may be greater than a third width W3 of the plurality of gate structures GS.

FIGS. 1 and 2A illustrate that each of the plurality of second fin-isolation insulating portions FS12 has substantially the same width in the first direction (the direction X). However, the inventive concepts are not limited thereto. Each of the plurality of second fin-isolation insulating portions FS12 may have a different width. FIG. 1 illustrates that lengths of the plurality of second fin-isolation insulating portions FS12 in the second direction (the direction Y) are approximately the same. However, the inventive concepts are not limited to the example illustrated in FIG. 1. In some embodiments, the plurality of second fin-isolation insulating portions FS12 may have a different length from each other in the second direction (the direction Y).

The plurality of fin-type active regions FA may include a pair of fin-type active regions FA aligned in a straight line extending in the first direction (the direction X) across the first fin-isolation insulating portion FS11 and the second fin-isolation insulating portions FS12, in the element region RX. The adjacent pair of fin-type active regions FA may be spaced apart from each other with one first fin-isolation insulating portion FS11 and two second fin-isolation insulating portions FS12 therebetween.

The second fin-isolation insulating portion FS12 may include a lower fin-isolation insulating portion LS and an upper fin-isolation insulating portion US located on the lower fin-isolation insulating portion LS. The upper fin-isolation insulating portion US and the lower fin-isolation insulating portion LS may be aligned in a vertical direction (direction Z) with respect to each other. The lower fin-isolation insulating portion LS may protrude from the upper fin-isolation insulating portion US toward the substrate 110. The lower fin-isolation insulating portion LS may not be disposed in the element-isolation region DTA. A bottom surface of the upper fin-isolation insulating portion US and a top surface of the lower fin-isolation insulating portion LS may contact each other. The gate structures GS may not be located in an upward direction (the direction Z) of the lower fin-isolation insulating portion LS. Rather, the upper fin-isolation insulating portion US may be located in the upward direction (the direction Z) of the lower fin-isolation insulating portion LS.

A width of the lower fin-isolation insulating portion LS may be similar to or less than a width W3 of the plurality of gate structures GS, while a width W1 of an upper portion of the upper fin-isolation insulating portion US may be greater than a width W2 of the plurality of gate structures GS.

The lower fin-isolation insulating portion LS may include a core insulating pattern LSC and a peripheral insulating pattern LSO covering a side surface and a bottom surface of the core insulating pattern LSC. The core insulating pattern LSC and the peripheral insulating pattern LSO may include a different material from each other.

In some embodiments, the peripheral insulating pattern LSO may include a nitride layer, and the core insulating pattern LSC and the upper fin-isolation insulating portion US may include an oxide layer. The core insulating pattern LSC and the upper fin-isolation insulating portion US may be formed via a different deposition process from each other. For example, the core insulating pattern LSC may be an oxide layer formed by an atomic layer deposition (ALD) process, and the upper fin-isolation insulating portion US may be an oxide layer formed by a chemical vapor deposition (CVD) process.

The upper fin-isolation insulating portion US may be formed as a single-layered structure including a single material, but is not limited thereto. In some embodiments, the upper fin-isolation insulating portion US may have a multi-layered structure in which a plurality of insulating patterns are sequentially stacked. For example, the upper fin-isolation insulating portion US may have a multi-layered structure in which at least two silicon oxide patterns formed by different deposition methods from each other are sequentially stacked. For example, the upper fin-isolation insulating portion US may have a structure in which at least two silicon oxide patterns formed by a CVD process are stacked on a silicon oxide pattern formed by an ALD process.

A portion of the first fin-isolation insulating portion FS11 and a portion of the second fin-isolation insulating portions FS12 may vertically overlap each other in the element region RX. The first fin-isolation insulating portion FS11 may include a first side wall S1 and a second side wall S2 each facing the opposite side in the first direction (the direction X). One of the pair of second fin-isolation insulating portions FS12 contacting the first fin-isolation insulating portion FS11 may contact the first side wall S1, and the other may contact the second side wall S2, in the element region RX.

A length of each of the plurality of second fin-isolation insulating portions FS12 in the vertical direction (the direction Z) may be greater than a length of the first fin-isolation insulating portion FS11 in the vertical direction (the direction Z). A vertical level of a lowermost surface of the first fin-isolation insulating portion FS11 may be substantially the same as the vertical level LV1 of the circumferential surface 110M of the substrate 110. However, the inventive concepts are not limited thereto. In some embodiments, the vertical level of the lowermost surface of the first fin-isolation insulating portion FS11 may be lower or higher than the vertical level LV1 of the circumferential surface 110M of the substrate 110. The term "vertical level" used in this specification denotes a length in a direction perpendicular to the circumferential surface 110M of the substrate 110, that is, a length in the direction Z).

A vertical level LV2 of a lowermost surface of the second fin-isolation insulating portions FS12 may be higher than the vertical level LV1 of the lowermost surface of the first fin-isolation insulating portion FS11. A vertical level LV3 of an uppermost surface of the first fin-isolation insulating portion FS11 and a vertical level LV4 of an uppermost surface of the second fin-isolation insulating portions FS12 may be different from each other. In some embodiments, the vertical level LV4 of the uppermost surface of the second fin-isolation insulating portions FS12 may be higher than the vertical level LV3 of the uppermost surface of the first fin-isolation insulating portion FS11. The vertical level LV3 of the uppermost surface of the first fin-isolation insulating portion FS11 may be substantially the same as the vertical level of the uppermost surface of the element-isolation layer 112. The vertical level LV3 of the uppermost surface of the first fin-isolation insulating portion FS11 may be lower than the vertical level LVF of the uppermost surface of the plurality of fin-type active regions FA, and the vertical level LV4 of the uppermost surface of the second fin-isolation insulating portions FS12 may be higher than the vertical level LVF of the uppermost surface of the plurality of fin-type active regions FA.

The lower fin-isolation insulating portion LS may be located between the vertical level LV1 of the circumferential surface 110M of the substrate 110 and a vertical level LVG of an uppermost surface of the gate structure GS. A vertical level LV2 of a lowermost surface of the lower fin-isolation insulating portion LS may be higher than the vertical level LV1 of the circumferential surface 110M of the substrate 110 and may be lower than a vertical level LVF of an uppermost surface FT of the fin-type active regions FA. Also, a vertical level LVO of an uppermost surface of the lower fin-isolation insulating portion LS may be higher than the vertical level LVF of the uppermost surface FT of the fin-type active regions FA and may be lower than the vertical level LVG of the uppermost surface of the gate structure GS. In some embodiments, the vertical level LVO of the uppermost surface of the lower fin-isolation insulating portion LS may be lower than a vertical level of an uppermost end of a plurality of second insulating spacers 122.

The vertical level LVO of the lowermost surface of the upper fin-isolation insulating portion US may be higher than the vertical level LVF of the uppermost surface FT of the fin-type active regions FA and may be lower than the vertical level LVG of the uppermost surface of the gate structure GS. Also, a vertical level LV4 of an uppermost surface of the upper fin-isolation insulating portion US may be higher than the vertical level LVG of the uppermost surface of the gate structure GS. In some embodiments, the vertical level LVO of the lowermost surface of the upper fin-isolation insulating portion US may be lower than the vertical level of the uppermost end of the plurality of second insulating spacers 122.

In some embodiments, top surfaces of the upper fin-isolation insulating portion US, the plurality of gate insulating capping layers 140, a plurality of first insulating spacers 120, and an inter-gate insulating layer 128 may be co-planar. That is, the top surfaces of the upper fin-isolation insulating portion US, the plurality of gate insulating capping layers 140, the plurality of first insulating spacers 120, and the inter-gate insulating layer 128 may have substantially the same vertical level LV4.

The plurality of gate structures GS may include a pair of dummy gate structures DGS extending in a straight line in the second direction (the direction Y) and spaced apart from each other in the second direction (the direction Y) with the second fin-isolation insulating portions FS12 therebetween.

Thus, the plurality of gate structures GS may be disposed not to vertically overlap the first fin-isolation insulating portion FS11 and the second fin-isolation insulating portion FS12.

The plurality of first insulating spacers 120 may cover both side walls of the plurality of gate structures GS. That is, both side walls of the gate structure GS may be covered by a pair of first insulating spacers 120. The plurality of first insulating spacers 120 may extend in a line shape in the second direction (the direction Y), together with the plurality of gate structures GS. The plurality of second insulating spacers 122 may cover both side walls of the plurality of second fin-isolation insulating portions FS12. That is, both side walls of the second fin-isolation insulating portion FS12 may be covered by a pair of second insulating spacers 122. The plurality of second insulating spacers 122 may extend in a line shape in the second direction (the direction Y), together with the plurality of second fin-isolation insulating portions FS12. The plurality of first insulating spacers 120 and the plurality of second insulating spacers 122 may include a silicon nitride layer, a SiOCN layer, a SiCN layer, or a combination thereof.

A length, that is, a height, of the plurality of second insulating spacers 122 in a vertical direction (direction Z) may be different from a length of the plurality of first insulating spacers 120 in the vertical direction (the direction Z). In some embodiments, the length of the plurality of second insulating spacers 122 in the vertical direction (the direction Z) may be less than the length of the plurality of first insulating spacers 120 in the vertical direction (the direction Z). A vertical level of an uppermost surface of the plurality of second insulating spacers 122 may be lower than a vertical level of an uppermost surface of the plurality of first insulating spacers 120. A vertical level of a lowermost surface of some of the plurality of second insulating spacers 122 may be equal to a vertical level of a lowermost surface of the plurality of first insulating spacers 120. A vertical level of a lowermost surface of the others of the plurality of second insulating spacers 122 may be lower than the vertical level LVF of the uppermost surface of the plurality of fin-type active regions FA. In some embodiments, the vertical level of the lowermost surface of the others of the plurality of second insulating spacers 122 may be substantially the same as the vertical level LVF of the uppermost surface of the first fin-isolation insulating portion FS11.

In some embodiments, a length in the vertical direction (the direction Z), that is, a height H1, of one of the pair of second fin-isolation insulating portions FS12 covering both side walls of the first fin-isolation insulating portion FS11, the one vertically overlapping the first fin-isolation insulating portion FS11, may be greater than a length in the vertical direction (the direction Z), that is, a height H2, of the other of the pair of second fin-isolation insulating portion FS12, the other not vertically overlapping the first fin-isolation insulating portion FS11.

FIG. 2A illustrates that a bottom surface of each of the first fin-isolation insulating portion FS11 and the plurality of second fin-isolation insulating portions FS12 is flat. However, the inventive concepts are not limited thereto. In some embodiments, the bottom surface of each of the first fin-isolation insulating portion FS11 and the plurality of second fin-isolation insulating portions FS12 may include a curved surface including a portion of a circle or a portion of an oval. In other embodiments, the bottom surface of each of the first fin-isolation insulating portion FS11 and the plurality of second fin-isolation insulating portions FS12 may include a non-planar surface having a point sharply projecting toward the substrate 110.

A recess 124R may be formed at both sides of the gate structures GS in the plurality of fin-type active regions FA, and a plurality of recesses 124R may be formed in each of the plurality of fin-type active regions FA. The plurality of recesses 124R may be filled with a plurality of source/drain regions 124. In some embodiments, the plurality of source/drain regions 124 may have an embedded SiGe structure including a plurality of SiGe layers that are epitaxially grown. The plurality of SiGe layers may each have a different Ge content. In other embodiments, the plurality of source/drain regions 124 may include an epitaxially grown Si layer or an epitaxially grown SiC layer.

In some embodiments, the plurality of source/drain regions 124 may be covered by an insulating liner. The insulating liner may conformally cover the element-isolation layer 112, the plurality of first insulating spacers 120, and the plurality of source/drain regions 124. The insulating liner may include a silicon nitride layer.

The source/drain region 124 and the gate structure GS may be insulated from each other via the first insulating spacer 120 between the source/drain region 124 and the gate structure GS. The source/drain region 124 may include a semiconductor layer epitaxially grown from the surface of the fin-type active regions FA included in an inner wall of the recess 124R. In some embodiments, the source/drain region 124 may have a top surface, of which a vertical level is approximately equal to the vertical level LVF of the uppermost surface FT of the fin-type active regions FA. However, it is not limited thereto.

The inter-gate insulating layer 128 may be between the plurality of gate structures GS. The plurality of source/drain regions 124 may be covered by the inter-gate insulating layer 128. The insulating liner may be between the plurality of source/drain regions 124 and the inter-gate insulating layer 128. The inter-gate insulating layer 128 may include a silicon oxide layer.

An insulating thin layer 150 may extend on the substrate 110 in parallel to the circumferential surface 110M of the substrate 110. The insulating thin layer 150 may cover the plurality of gate structures GS, the plurality of gate insulating capping layers 140, the plurality of first insulating spacers 120, the plurality of upper fin-isolation insulating portions US, and the inter-gate insulating layer 128. The insulating thin layer 150 may include a silicon oxide layer, a silicon nitride layer, a polysilicon layer, or a combination thereof. An interlayer insulating layer 160 may be formed on the insulating thin layer 150. The interlayer insulating layer 160 may include a silicon oxide layer, a silicon nitride layer, or a combination thereof.

A plurality of contact plugs 184 may penetrate the interlayer insulating layer 160, the insulating thin layer 150, and the inter-gate insulating layer 128 and may be connected to the plurality of source/drain regions 124. In some embodiments, a plurality of conductive barrier layers 182 may cover a side surface and a bottom surface of the plurality of contact plugs 184. In some embodiments, the plurality of conductive barrier layers 182 and the plurality of contact plugs 184 may extend into the plurality of source/drain regions 124.

The plurality of contact plugs 184 may include, for example, a metal material, a metal nitride, or a metal alloy. The plurality of conductive barrier layers 182 may include, for example, Ti, Ta, TiN, TaN, or a combination thereof.

In some embodiments, a silicide layer may be disposed between the conductive barrier layers 182 and the source/drain regions 124. The silicide layer may include, for example, tungsten silicide (WSi), titanium silicide (TiSi), cobalt silicide (CoSi), or nickel silicide (NiSi).

Although not additionally illustrated, a plurality of gate contacts penetrating the interlayer insulating layer 160, the insulating thin layer 150, and the gate insulating capping layer 140 and connected to the plurality of gate lines GL may further be formed. In some embodiments, a side surface and a bottom surface of the plurality of gate contacts may be covered by a plurality of conductive gate barrier layers. The conductive gate barrier layer and the gate contact may have substantially the same structure as the conductive barrier layer 182 and the contact plug 184, respectively. In some embodiments, the conductive gate barrier layer and the gate contact may be simultaneously formed with the conductive barrier layer 182 and the contact plug 184, respectively. However, embodiments are not limited thereto, and the conductive gate barrier layer and the gate contact may be separately formed from the conductive barrier layer 182 and the contact plug 184, respectively.

The first fin-isolation insulating portion FS11 and the second fin-isolation insulating portions FS12 may be disposed between the gate structures GS in the element region RX. One first fin-isolation insulating portion FS11 and two second fin-isolation insulating portions FS12 may be disposed between two gate structures GS in the first direction (the direction X) in the element region RX.

A pair of dummy gate structures DGS extending in a straight line may be disposed at both external sides of the element region RX in the second direction (the direction Y) with one second fin-isolation insulating portion FS12 therebetween. Thus, the plurality of gate structures GS and the plurality of second fin-isolation insulating portions FS12 may be disposed at a constant pitch PT in the first direction (the direction X) in the element region RX.

The second fin-isolation insulating portions FS12 may be disposed at a side of the plurality of gate structures GS, around which the plurality of MOS transistors are formed. The second fin-isolation insulating portions FS12 may be disposed at an external side of the gate structures GS. The second fin-isolation insulating portions FS12 may apply tensile stress or compressive stress to channel regions of the fin-type active regions FA adjacent to the fin-isolation insulating portions FS. Thus, the stress due to the second fin-isolation insulating portions FS12 may be applied to the plurality of MOS transistors formed along the gate structures GS, to boost or degrade the characteristics of each of the plurality of MOS transistors.

The integrated circuit device 100 according to the inventive concepts may boost or degrade the characteristics of the MOS transistor included in the integrated circuit device 100, by using the plurality of second fin-isolation insulating portions FS12 contacting a first side wall S1 and a second side wall S2 of the first fin-isolation insulating portion FS11 for obtaining insulating distances between wires and contacts. Thus, a higher operational speed and/or higher operational accuracy may be achieved without increasing an area of the integrated circuit device 100.

Figure 2B:
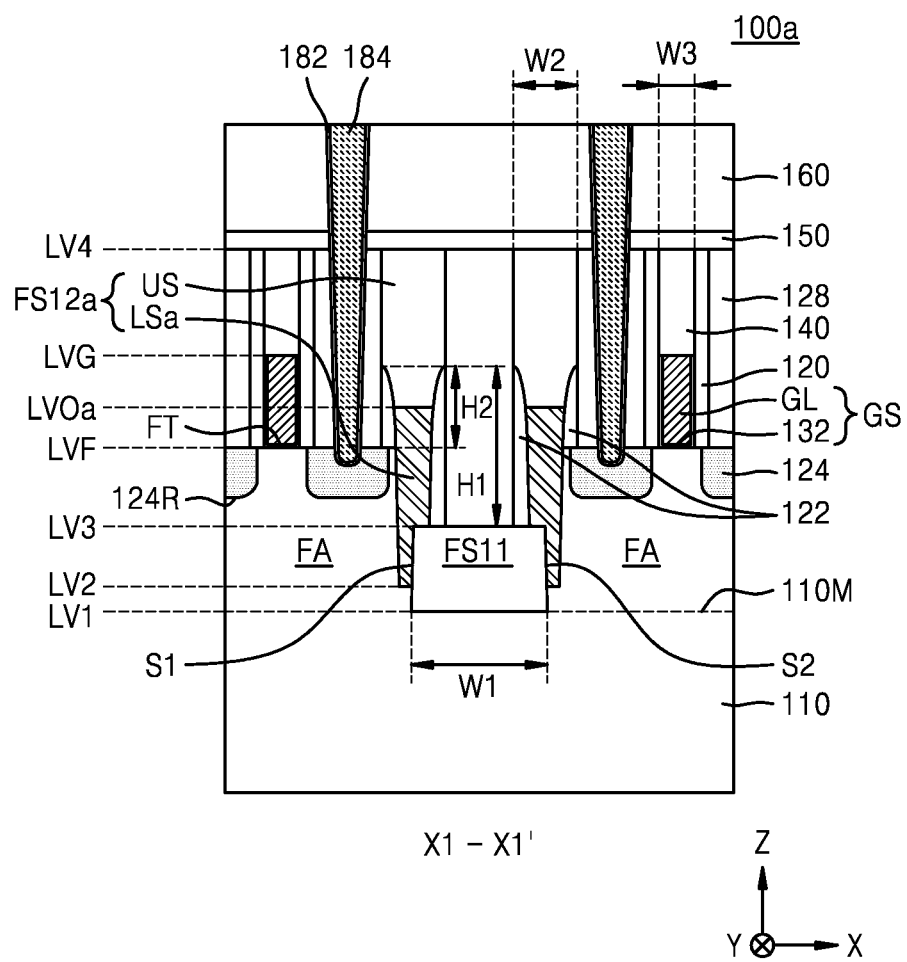
FIG. 2B is a cross-sectional view for describing an integrated circuit device according to another embodiment.

FIG. 2B is a cross-sectional view for describing an integrated circuit device 100a according to another embodiment. In detail, FIG. 2B is an example cross-sectional view taken along a line X1-X1' of FIG. 1. Like reference numerals in FIGS. 1 and 2A refer to like elements in FIG. 2B and their detailed descriptions will be omitted.

Referring to FIG. 2B, the integrated circuit device 100a may have substantially the same structure as the integrated circuit device 100 of FIG. 2A. However, the integrated circuit device 100a may include a plurality of second fin-isolation insulating portions FS12a, rather than the plurality of second fin-isolation insulating portions FS12.

The plurality of second fin-isolation insulating portions FS12a may include a lower fin-isolation insulating portion LSa and the upper fin-isolation insulating portion US located on the lower fin-isolation insulating portion LSa. The upper fin-isolation insulating portion US and the lower fin-isolation insulating portion LSa may be aligned in a vertical direction (the direction Z) with respect to each other. A bottom surface of the upper fin-isolation insulating portion US and a top surface of the lower fin-isolation insulating portion LSa may contact each other. The gate structure GS may not be located in an upward direction (the direction Z) of the lower fin-isolation insulating portion LSa, and the upper fin-isolation insulating portion US may be located in the upward direction (the direction Z) of the lower fin-isolation insulating portion LSa. The lower fin-isolation insulating portion LSa may be formed to have a single-layered structure including a single material.

In some embodiments, the lower fin-isolation insulating portion LSa may include a nitride layer, and the upper fin-isolation insulating portion US may include an oxide layer.

The lower fin-isolation insulating portion LSa may be located between the vertical level LV1 of the circumferential surface 110M of the substrate 110 and the vertical level LVG of the uppermost surface of the gate structures GS. A vertical level LV2 of a lowermost surface of the lower fin-isolation insulating portion LSa may be higher than the vertical level LV1 of the circumferential surface 110M of the substrate 110 and lower than the vertical level LVF of the uppermost surface FT of the fin-type active regions FA. Also, a vertical level LVOa of an uppermost surface of the lower fin-isolation insulating portion LSa may be higher than the vertical level LVF of the uppermost surface FT of the fin-type active regions FA and lower than the vertical level LVG of the uppermost surface of the gate structure GS.

The vertical level LVOa of the lowermost surface of the upper fin-isolation insulating portion US may be higher than the vertical level LVF of the uppermost surface FT of the fin-type active regions FA and lower than the vertical level LVG of the uppermost surface of the gate structure GS. Also, a vertical level LV4 of an uppermost surface of the upper fin-isolation insulating portion US may be higher than the vertical level LVG of the uppermost surface of the gate structure GS.

FIGS. 3A, 3B, and 3C through 16A, 16B, and 16C are cross-sectional views illustrated in a process order for describing a method of manufacturing an integrated circuit device, according to embodiments. In detail, FIGS. 3A, 4A, 5A, 6A, 7A, 8A, 9A, 10A, 11A, 12A, 13A, 14A, 15A, and 16A are cross-sectional views of a portion corresponding to the line X1-X1' of FIG. 1, FIGS. 3B, 4B, 5B, 6B, 7B, 8B, 9B, 10B, 11B, 12B, 13B, 14B, 15B, and 16B are cross-sectional views of a portion corresponding to a line Y1-Y1' of FIG. 1, and FIGS. 3C, 4C, 5C, 6C, 7C, 8C, 9C, 10C, 11C, 12C, 13C, 14C, 15C, and 16C are cross-sectional views of a portion corresponding to a line Y2-Y2' of FIG. 1.

Figure 3A:
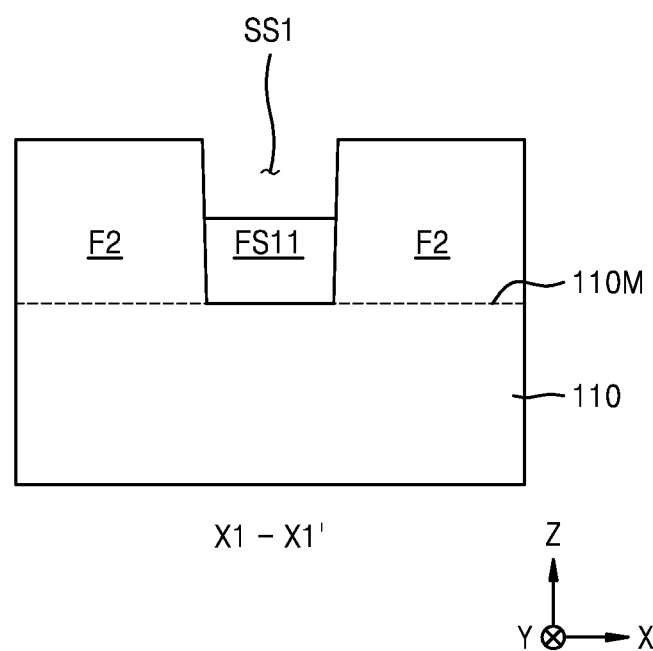
Figure 3B:
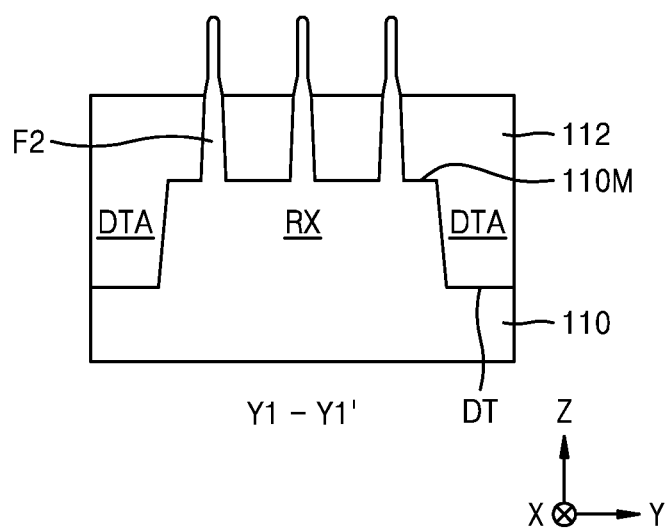
Figure 3C:
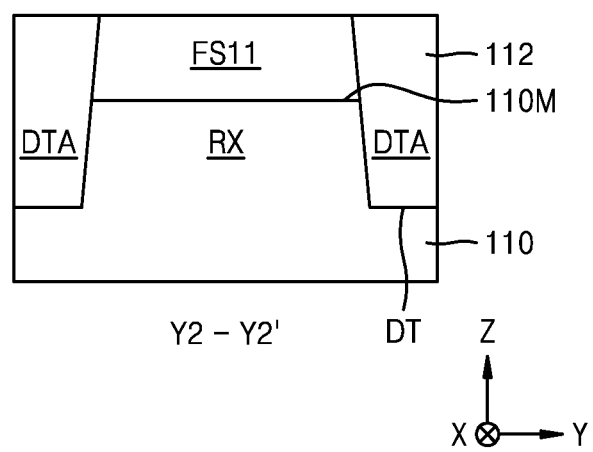

Referring to FIGS. 3A through 3C together, the plurality of preliminary fin-type active regions F2 protruding from the circumferential surface 110M of the substrate 110 toward an upward direction (the direction Z) and extending in the first direction (the direction X) may be formed by etching a portion of the substrate 110, and the element-isolation layer 112 covering both lower side walls of each of the plurality of preliminary fin-type active regions F2 may be formed. The plurality of preliminary fin-type active regions F2 may protrude above a top surface of the element-isolation layer 112 in the element region RX.

The deep trench DT defining the element region RX may be formed by etching a portion of the element-isolation layer 112 and a portion of the substrate 110, and the element-isolation region DTA may be formed by filling the deep trench DT with an insulating layer. In some embodiments, after the plurality of preliminary fin-type active regions F2 and the deep trench DT are formed, the element-isolation layer 112 and the element-isolation region DTA may be formed together.

When the plurality of preliminary fin-type active regions F2 are formed in the element region RX, a first fin-isolation space SS1 may be provided on the circumferential surface 110M of the substrate 110 between a pair of preliminary fin-type active regions F2. When a portion of the substrate 110 is etched to form the plurality of preliminary fin-type active regions F2, a portion of the substrate 110, the portion corresponding to the first fin-isolation space SS1, may also be etched to form the first fin-isolation space SS1.

Figure 4A:
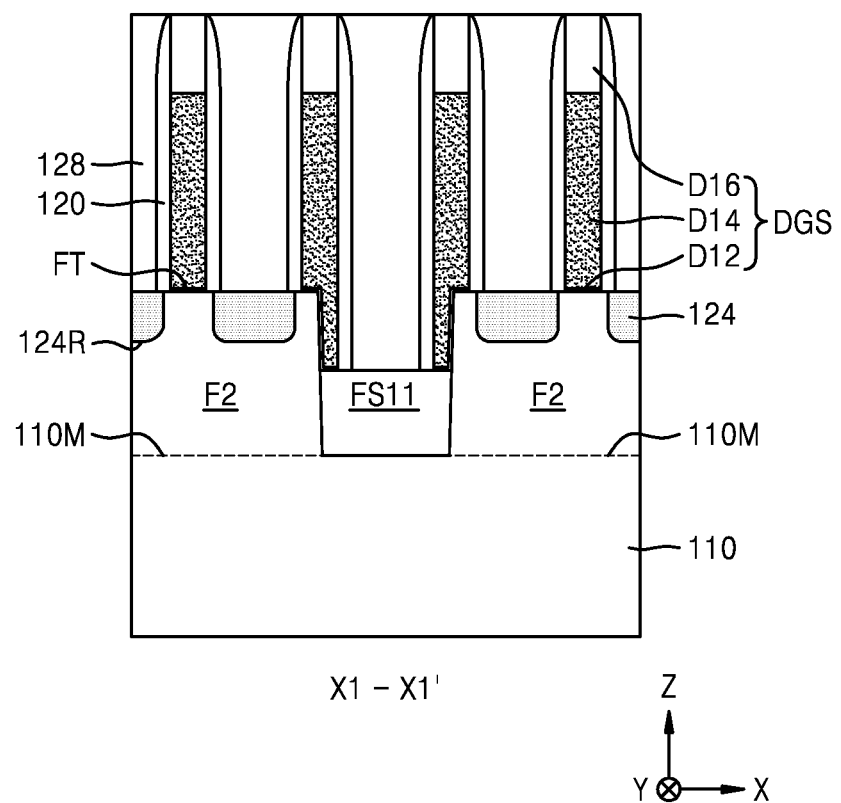
Figure 4B:
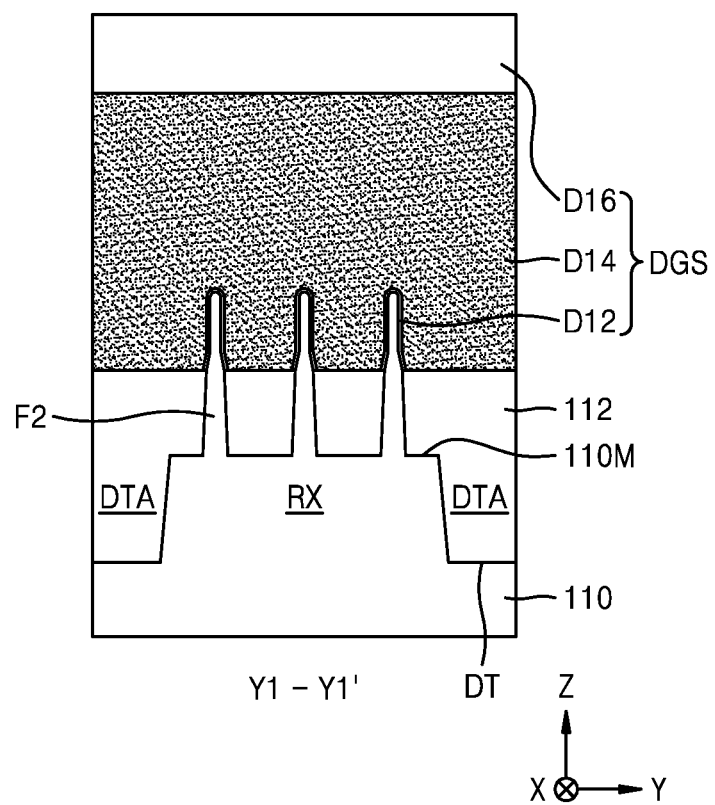
Figure 4C:
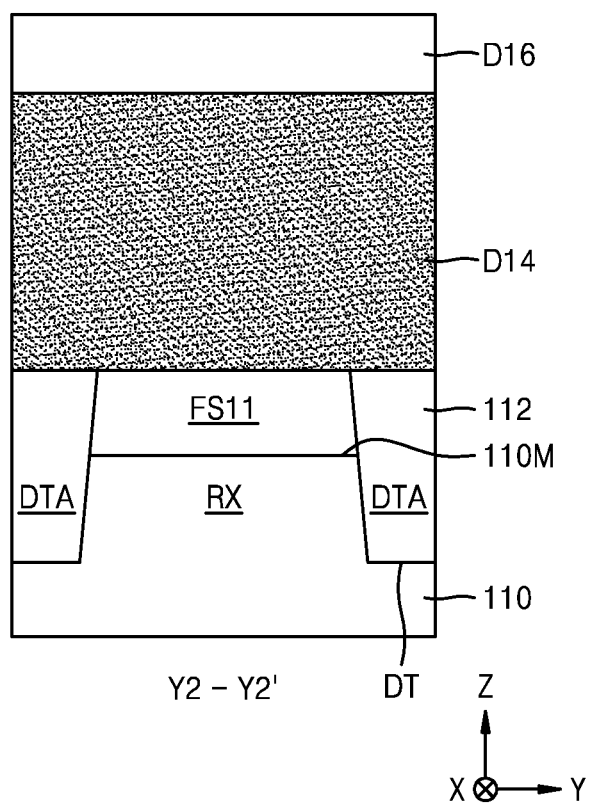

Referring to FIGS. 4A through 4C together, the plurality of dummy gate structures DGS extending to cross the plurality of preliminary fin-type active regions F2 may be formed on the plurality of preliminary fin-type active regions F2. Each of the plurality of dummy gate structures DGS may include a dummy gate insulating layer D12, a dummy gate line D14, and a dummy gate insulating capping layer D16 sequentially stacked on the preliminary fin-type active regions F2. The dummy gate insulating layer D12 may include silicon oxide. The dummy gate line D14 may include polysilicon. The dummy gate insulating capping layer D16 may include silicon nitride.

The first insulating spacer 120 may be formed at both side walls of the dummy gate structure DGS. The first insulating spacer 120 may be formed by using an ALD process or a CVD process.

The plurality of recesses 124R may be formed at both sides of the dummy gate structures DGS by etching portions of the preliminary fin-type active regions F2, and the plurality of source/drain regions 124 may be formed by forming semiconductor layers by performing an epitaxial growth process in the plurality of recesses 124R.

The inter-gate insulating layer 128 filling a space defined by the plurality of source/drain regions 124, the plurality of dummy gate structures DGS, and the first insulating spacers 120 may be formed. In order to form the inter-gate insulating layer 128, an insulating layer covering a structure including the plurality of dummy gate structures DGS and the plurality of source/drain regions 124 via a sufficient thickness may be formed, and then, the insulating layer may be planarized to expose a top surface of the dummy gate insulating capping layer D16.

In some embodiments, an insulating liner conformally covering the plurality of source/drain regions 124, the plurality of dummy gate structures DGS, and the first insulating spacers 120 may be formed first, and then, the inter-gate insulating layer 128 may be formed on the insulating liner.

Some of the plurality of dummy gate structures DGS may cover a top surface of the first fin-isolation insulating portion FS11 and fill a portion of the first fin-isolation space SS1 (refer to FIG. 3A).

Figure 5A:
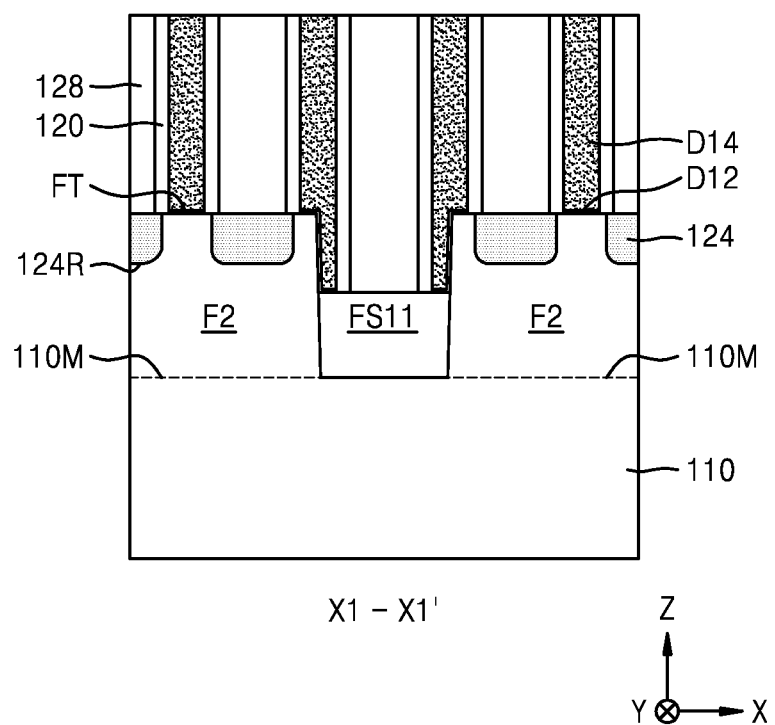
Figure 5B:
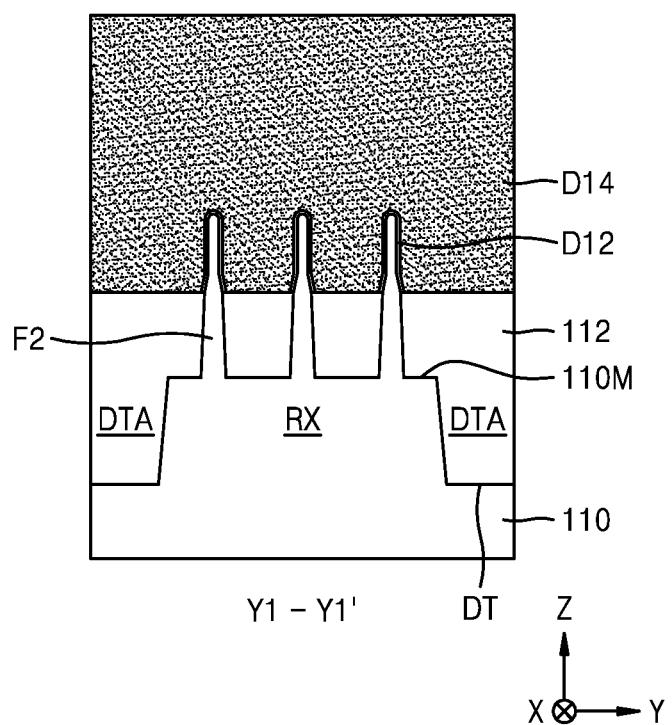
Figure 5C:
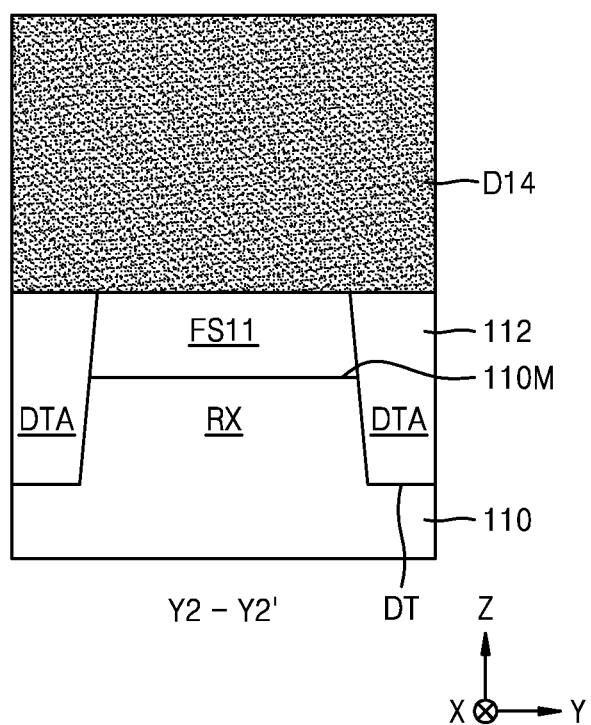

Referring to FIGS. 5A through 5C together, a planarization process may be performed, whereby a portion of the first insulating spacer 120, a portion of the inter-gate insulating layer 128, and the dummy gate insulating capping layer (D16 of FIGS. 4A through 4C) are removed, in order to expose a top surface of the dummy gate line D14. In some embodiments, the process illustrated in FIGS. 4A through 4C and the process illustrated in FIGS. 5A through 5C may be sequentially performed via an in-situ process.

Figure 6A:
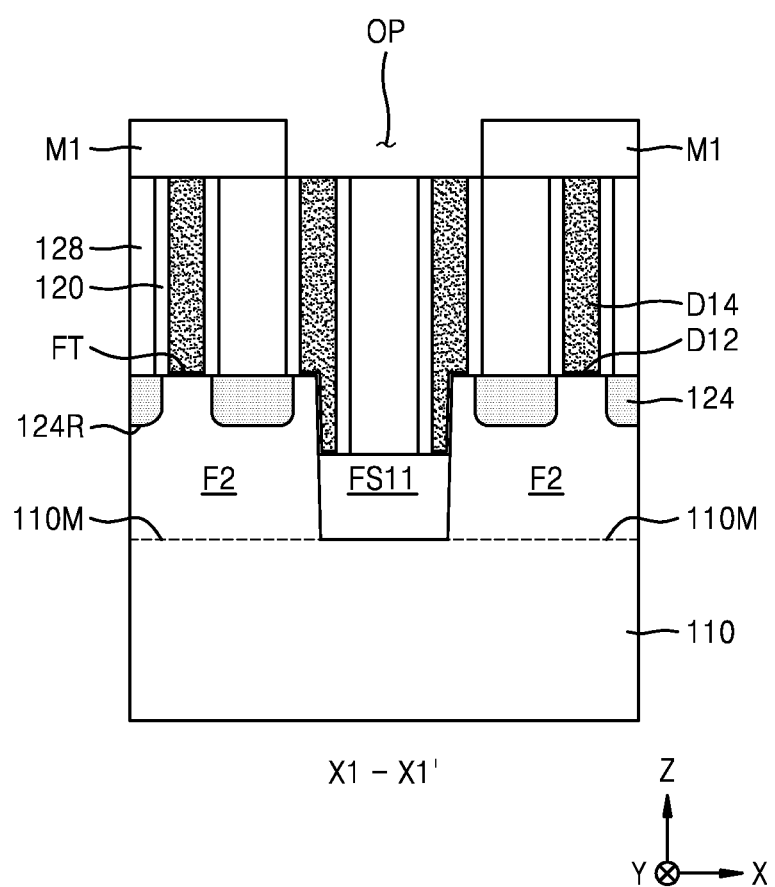
Figure 6B:
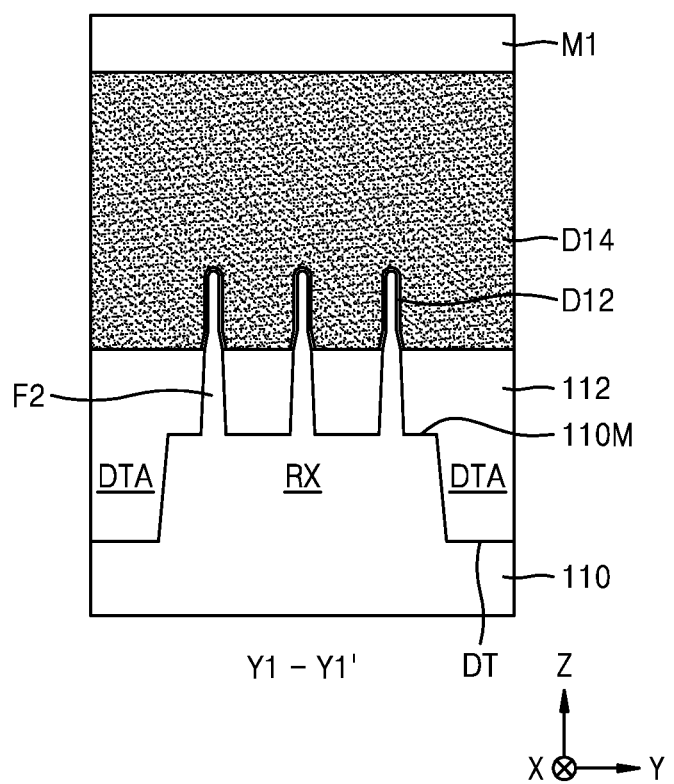
Figure 6C:
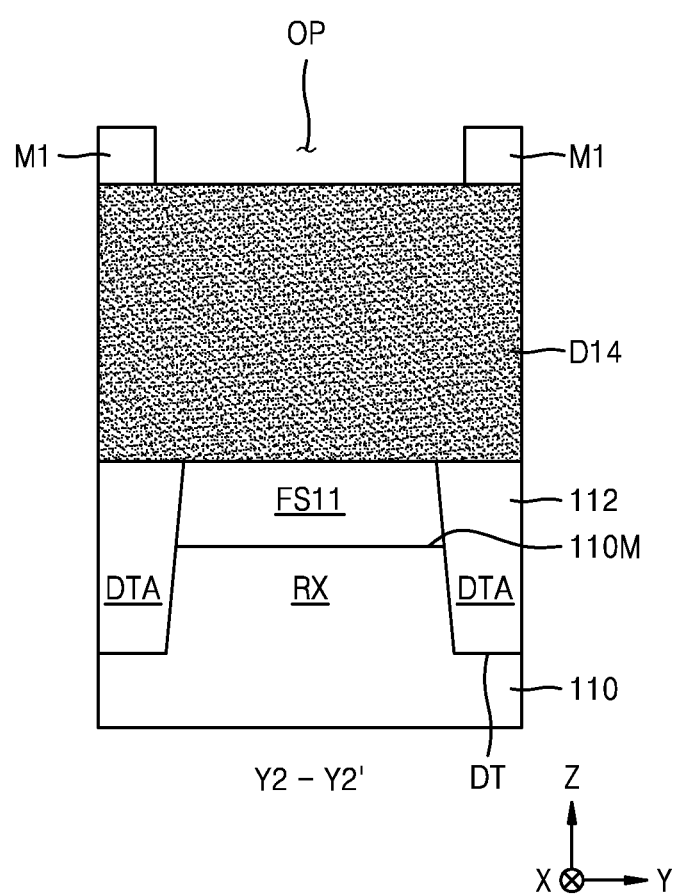

Referring to FIGS. 6A through 6C together, a mask pattern M1 may be formed on an object resulting from the method described with reference to FIGS. 5A through 5C. The mask pattern M1 may have an opening OP exposing a portion of the dummy gate line D14. A planar shape of the opening OP may include two adjacent fin-isolation insulating portions FS illustrated in FIG. 1 and may correspond to a planar shape not including the plurality of gate structures GS. The mask pattern M1 may have a multi-layered structure of a stack of a plurality of hard mask layers. In some embodiments, the mask pattern M1 may include a silicon nitride layer, a silicon oxide layer, a polysilicon layer, a carbon-containing layer, or a combination thereof. The carbon-containing layer may include a spin-on hardmask (SOH) material.

In some embodiments, a portion of each of two dummy gate lines D14 may be exposed via the opening OP.

Figure 7A:
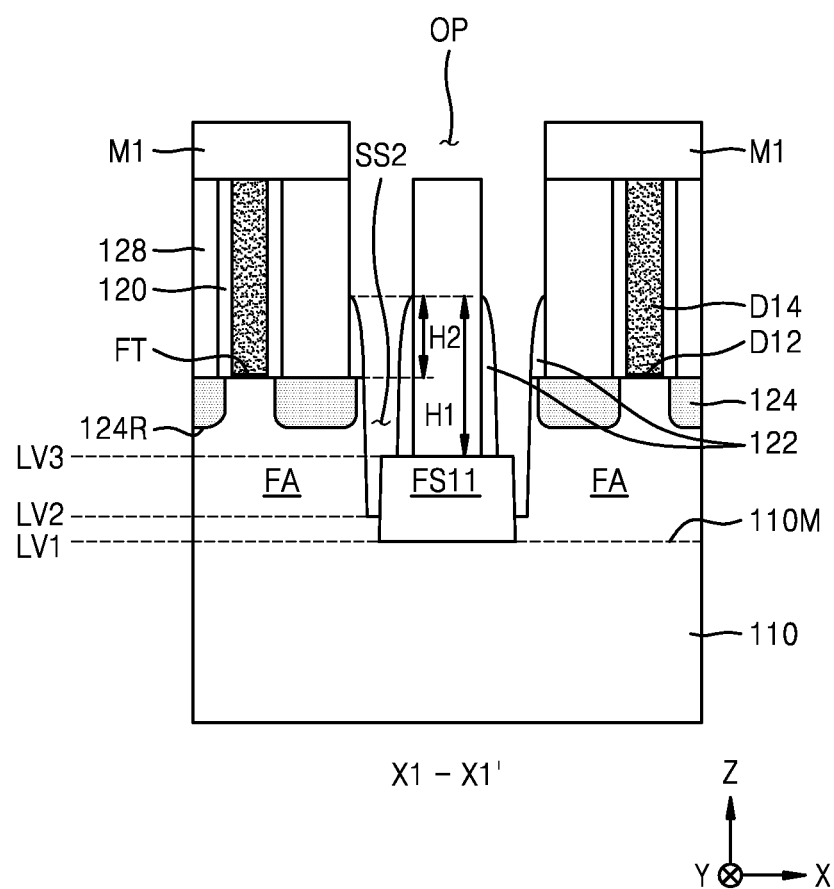
Figure 7B:
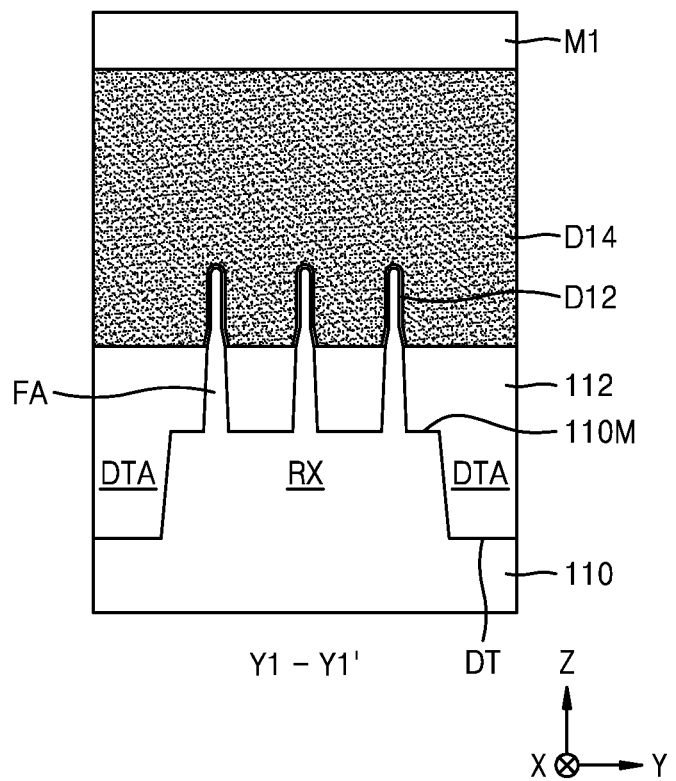
Figure 7C:
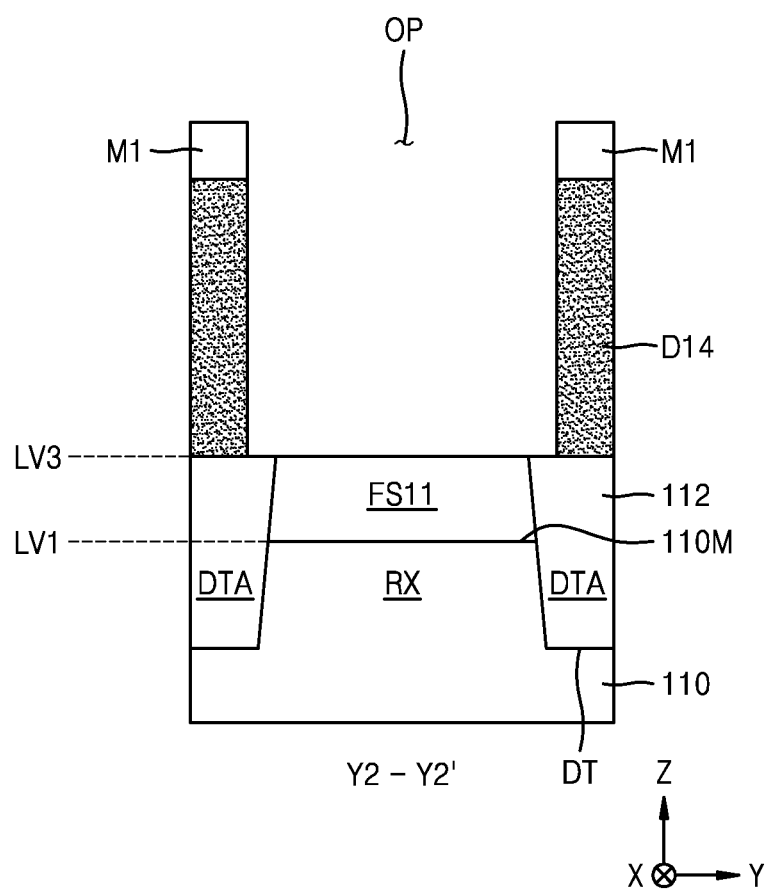

Referring to FIGS. 7A through 7C together, a portion of the dummy gate line D14 exposed via the opening OP may be selectively removed by using the mask pattern M1, formed by the method described with reference to FIGS. 6A through 6C, as an etch mask, and the dummy gate insulating layer D12 exposed as a result thereof may be removed. Then, the plurality of preliminary fin-type active regions F2 exposed via the opening OP after the dummy gate insulating layer D12 is removed, may be etched to form a plurality of second fin-isolation spaces SS2. Since the second fin-isolation spaces SS2 are formed in the element region RX, the preliminary fin-type active regions F2 may be separated into the plurality of fin-type active regions FA.

A vertical level LV2 of a lowermost surface of the plurality of second fin-isolation spaces SS2 may be higher than the vertical level LV1 of the circumferential surface 110M of the substrate 110. The first fin-isolation insulating portion FS11 may be exposed in a first element region RX1 via the plurality of second fin-isolation spaces SS2

While the dummy gate line D14, the dummy gate insulating layer D12, and the preliminary fin-type active regions F2 are etched to form the plurality of second fin-isolation spaces SS2, a portion of the first insulating spacer 120 exposed to etching together via the opening OP may be removed. Accordingly, the plurality of second insulating spacers 122, which are lower than the first insulating spacers 120, may be formed.

When the plurality of second insulating spacers 122 are formed, an upper entrance of the plurality of second fin-isolation spaces SS2 may have a relatively great width in the first direction (the direction X), and a portion of the plurality of second fin-isolation spaces SS2, the portion being defined by the plurality of fin-type active regions FA, may have a relatively less width in the first direction (the direction X).

Figure 8A:
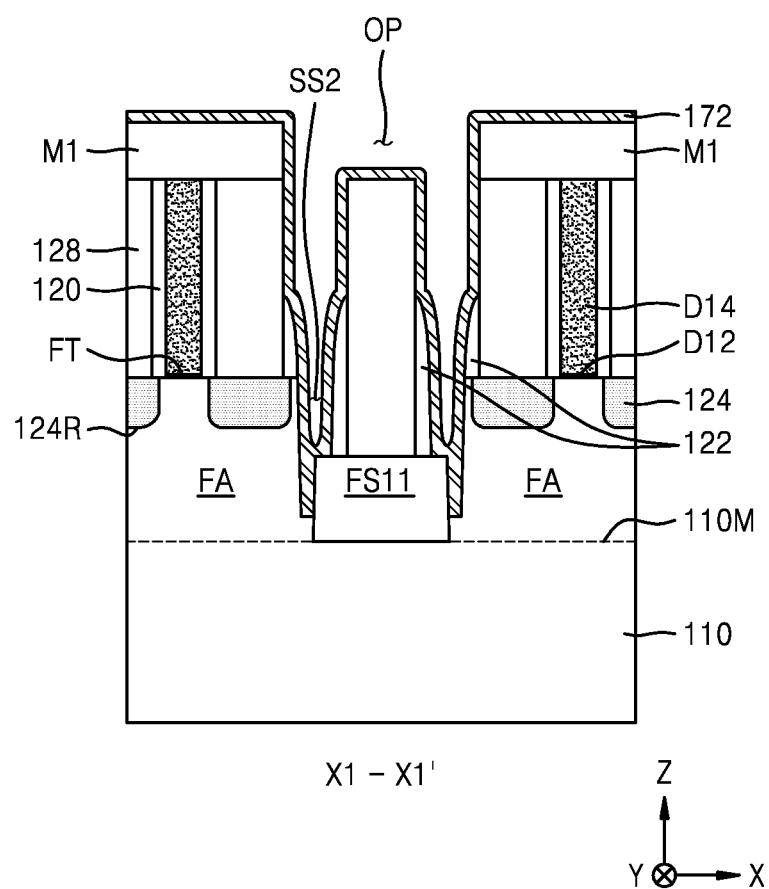
Figure 8B:
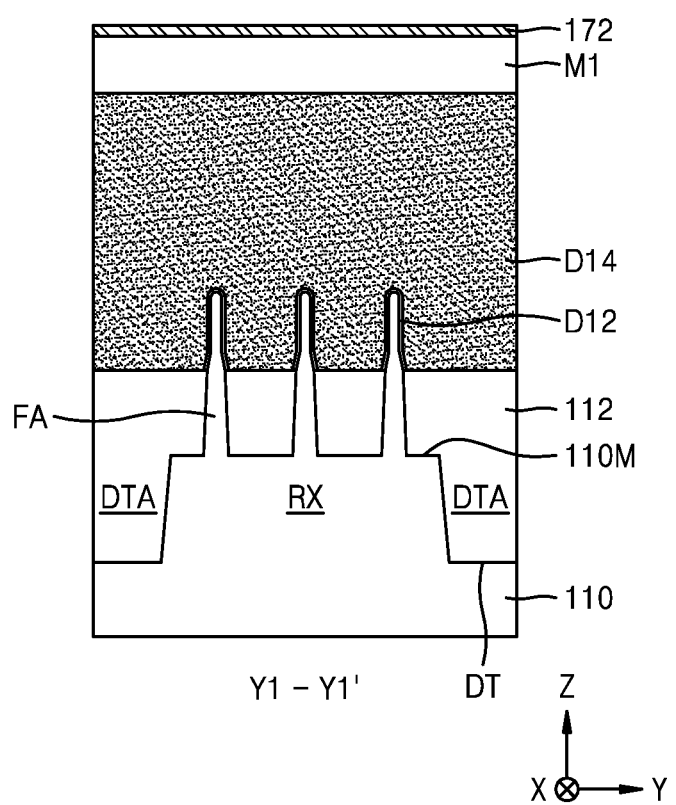
Figure 8C:
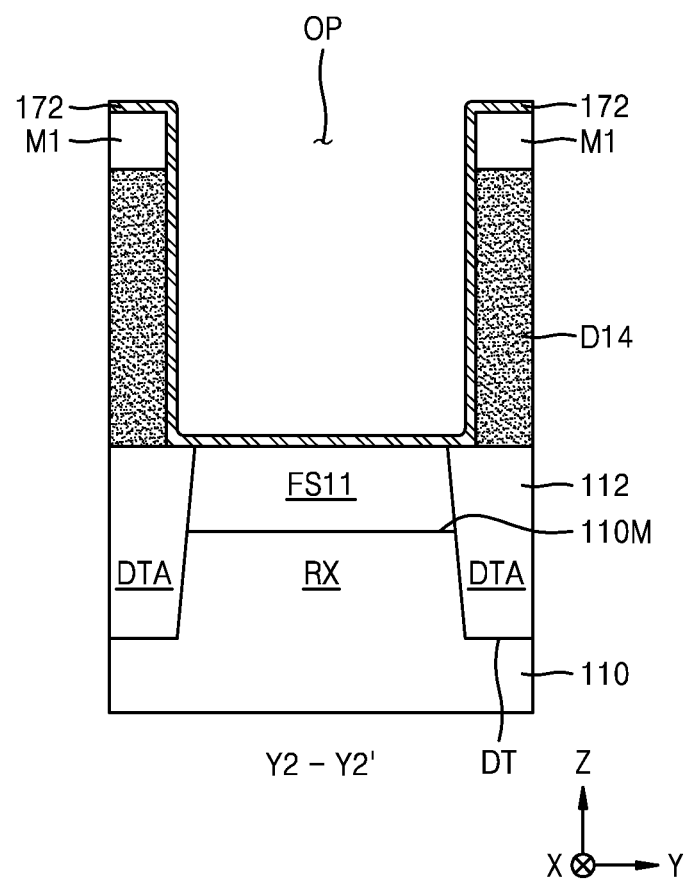

Referring to FIGS. 8A through 8C together, a first lower fin-isolation insulating layer 172 conformally covering an inner surface of the second fin-isolation spaces SS2 may be formed. The first lower fin-isolation insulating layer 172 may also cover a top surface and a side surface of the mask pattern M1. The first lower fin-isolation insulating layer 172 may include, for example, a nitride layer. The first lower fin-isolation insulating layer 172 may be formed by using an ALD process.

Figure 9A:
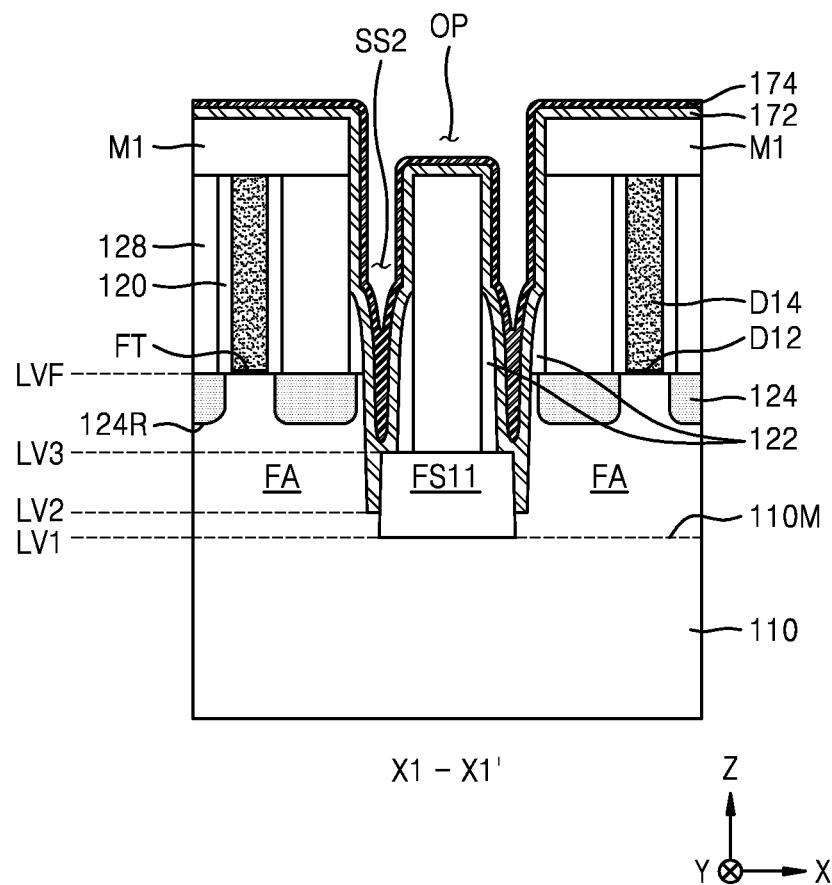
Figure 9B:
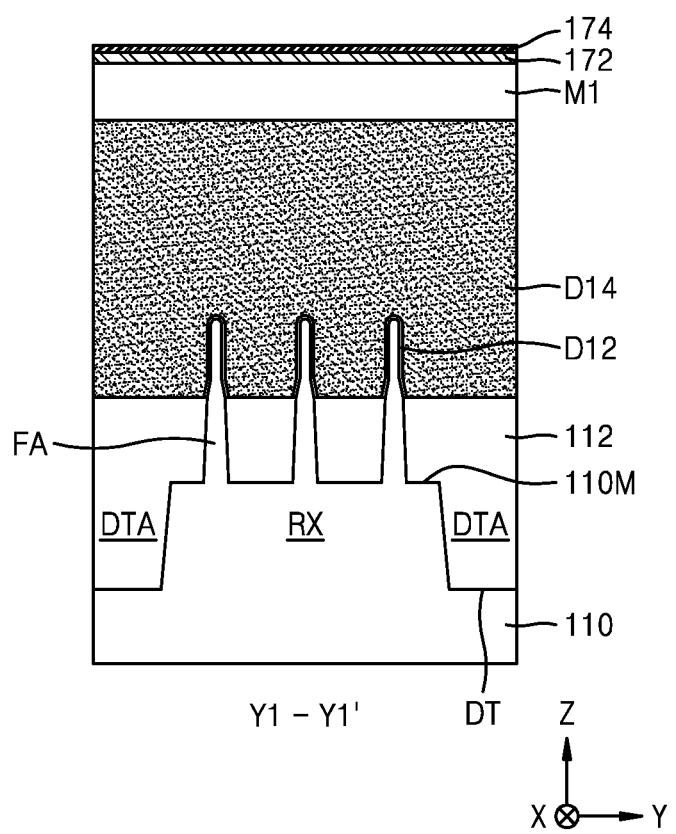
Figure 9C:
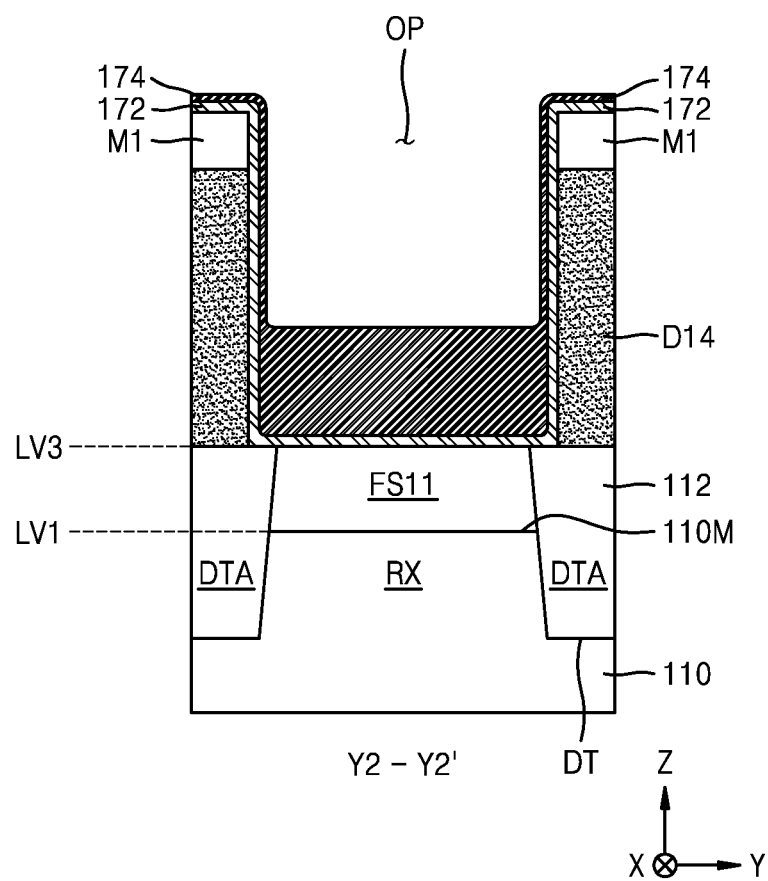

Referring to FIGS. 9A through 9C together, a second lower fin-isolation insulating layer 174 covering the first lower fin-isolation insulating layer 172 may be formed. The second lower fin-isolation insulating layer 174 may include, for example, an oxide layer. The second lower fin-isolation insulating layer 174 may be formed by using an ALD process or a CVD process. The second lower fin-isolation insulating layer 174 may be formed to fill a lower portion of the second fin-isolation spaces SS2. The first lower fin-isolation insulating layer 172 and the second lower fin-isolation insulating layer 174 may fill from a bottom surface of the second fin-isolation spaces SS2 to a level higher than the vertical level LVF of the uppermost surface FT of the fin-type active regions FA.

Figure 10A:
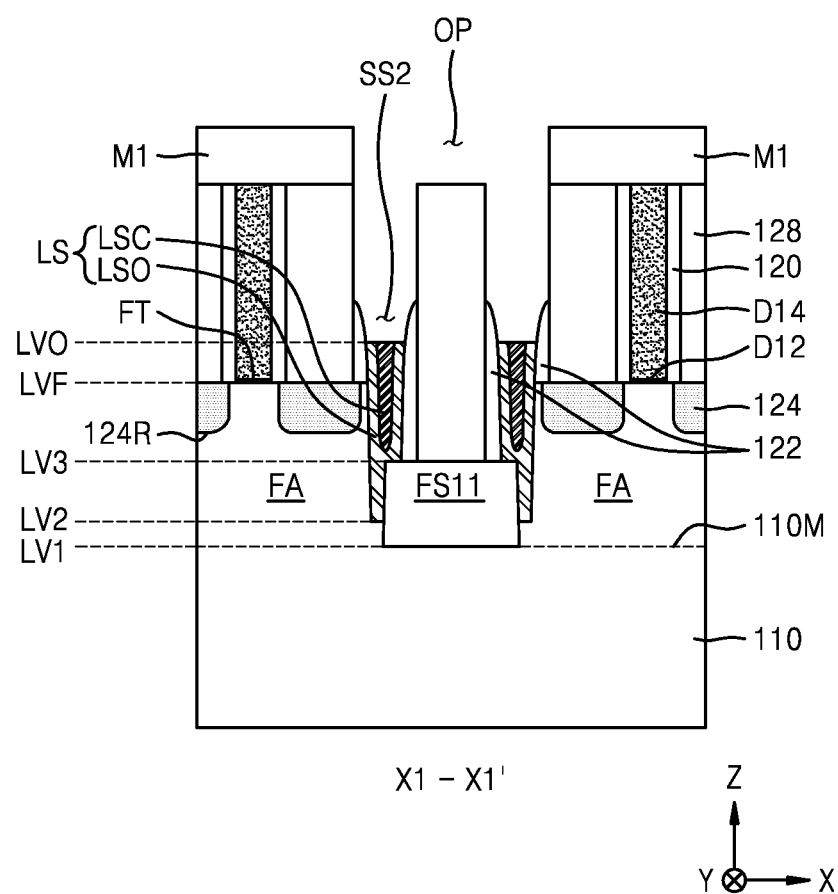
Figure 10B:
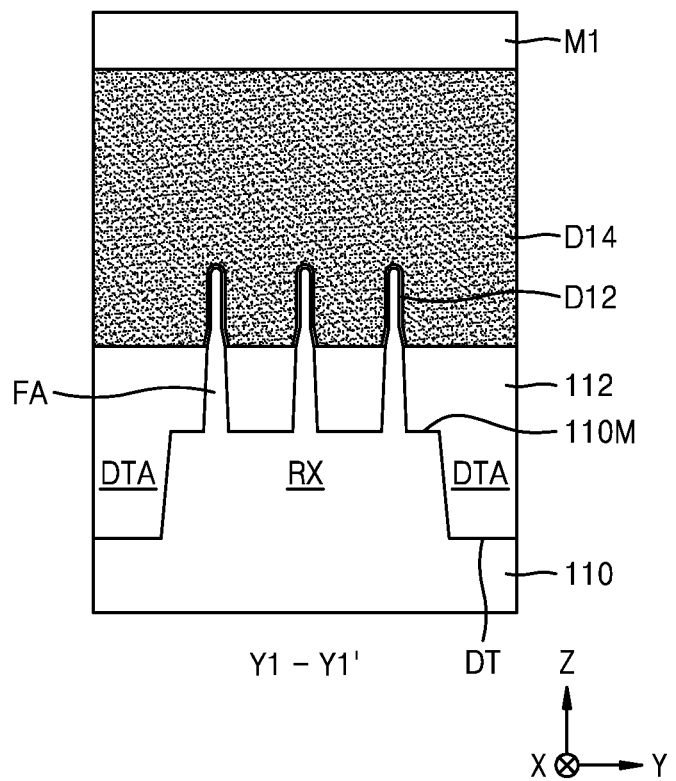
Figure 10C:
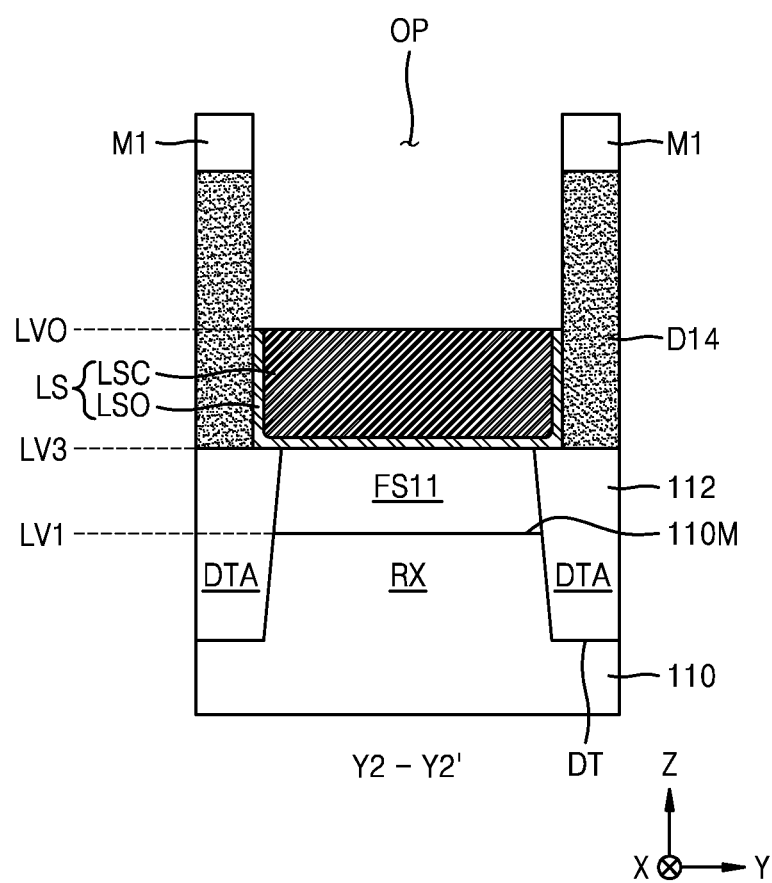

Referring to FIGS. 10A through 10C together, upper portions of the second lower fin-isolation insulating layer 174 and the first lower fin-isolation insulating layer 172 may be removed from an object resulting from the method described with reference to FIGS. 9A through 9C, to form the lower fin-isolation insulating portion LS. In order to form the lower fin-isolation insulating portion LS, the upper portions of the second lower fin-isolation insulating layer 174 and the first lower fin-isolation insulating layer 172 may be removed by using a wet etching process and a dry etching process.

The lower fin-isolation insulating portion LS may include the core insulating pattern LSC and the peripheral insulating pattern LSO covering side surfaces and a bottom surface of the core insulating pattern LSC. The core insulating pattern LSC and the peripheral insulating pattern LSO may be a portion of the second lower fin-isolation insulating layer 174 and a portion of the first lower fin-isolation insulating layer 172, respectively.

The vertical level LVO of the uppermost surface of the lower fin-isolation insulating portion LS may be higher than the vertical level LVF of the uppermost surface FT of the fin-type active regions FA and may be lower than a vertical level of an uppermost surface of the dummy gate line D14.

Figure 11A:
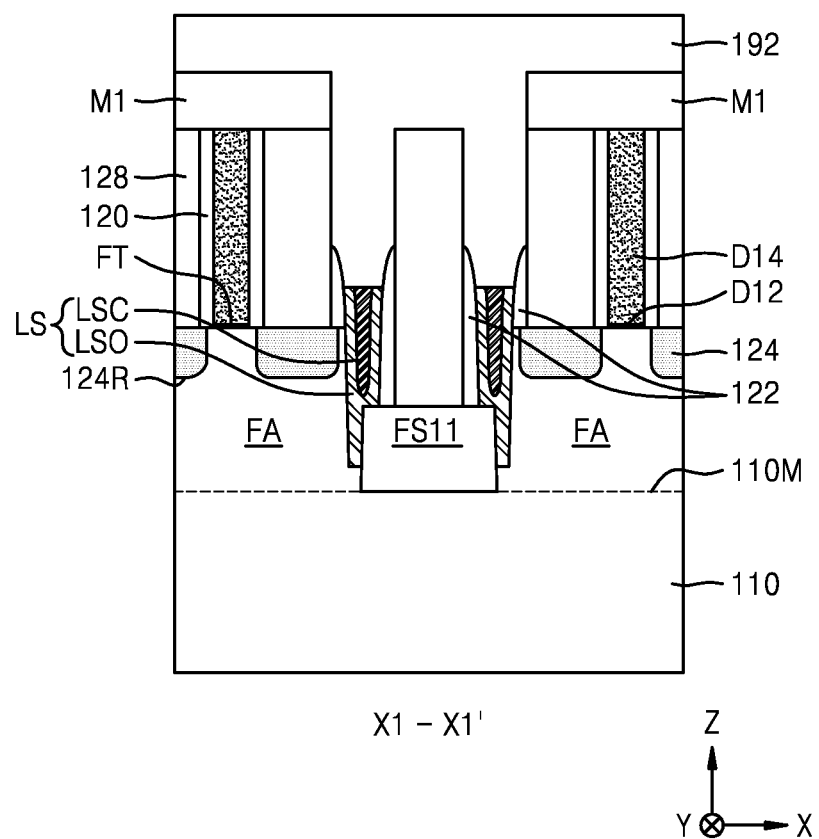
Figure 11B:
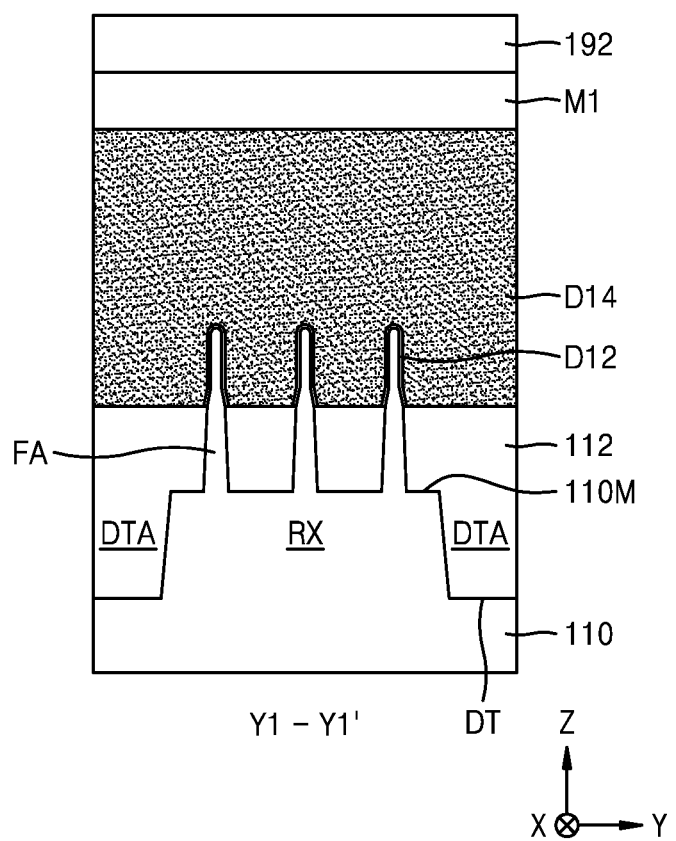
Figure 11C:
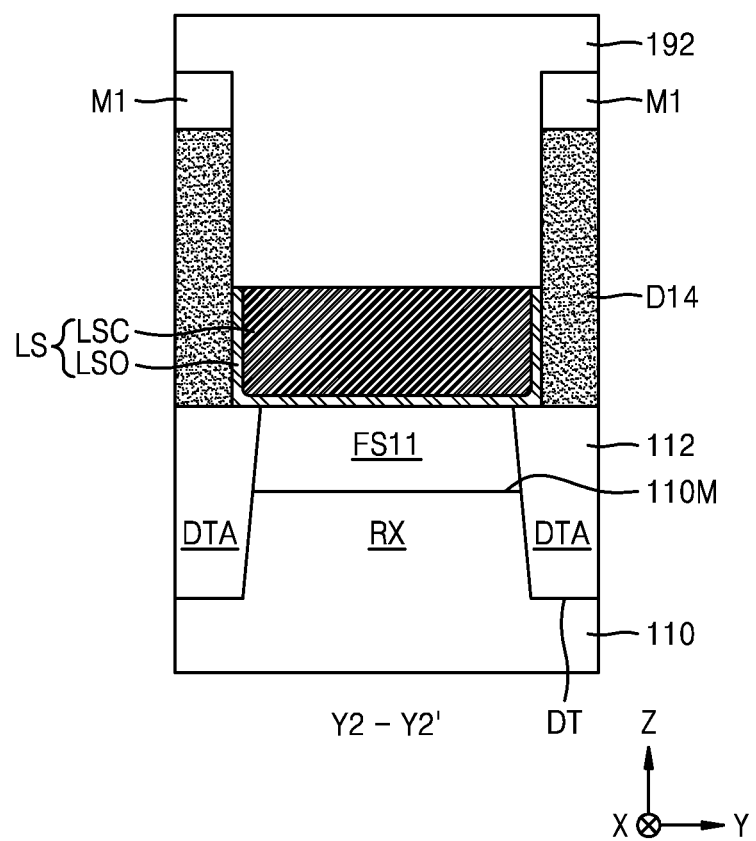

Referring to FIGS. 11A through 11C together, a gap-fill insulating layer 192 filling all of the second fin-isolation spaces SS2 may be formed on an object resulting from the method described with reference to FIGS. 10A through 10C. The gap-fill insulating layer 192 may fill all of the second fin-isolation spaces SS2 and may be formed to cover both the top surface and the side surface of the mask pattern M1.

Figure 12A:
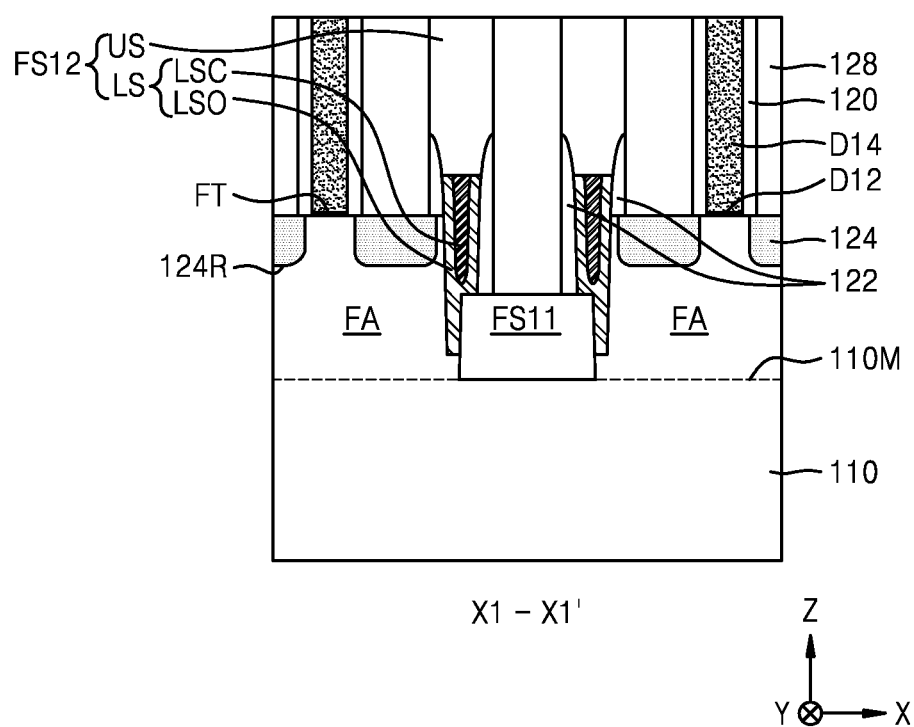
Figure 12B:
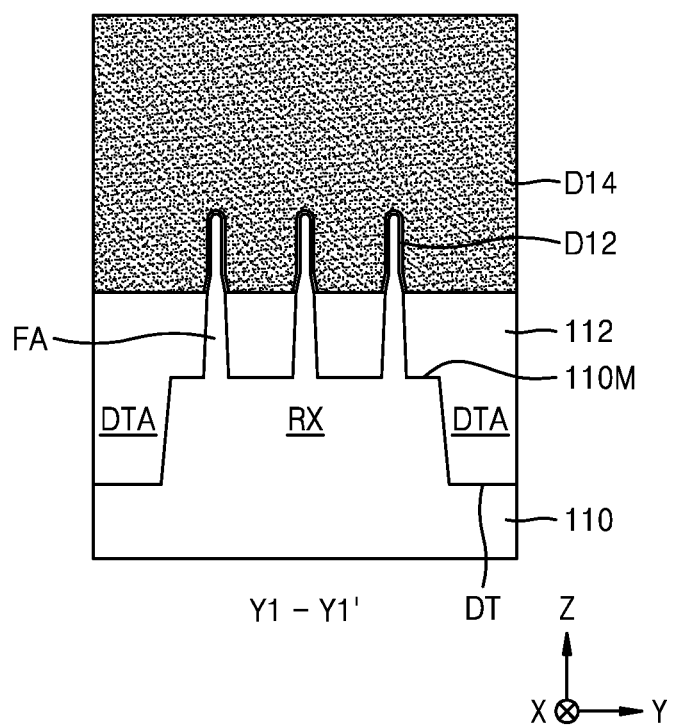
Figure 12C:
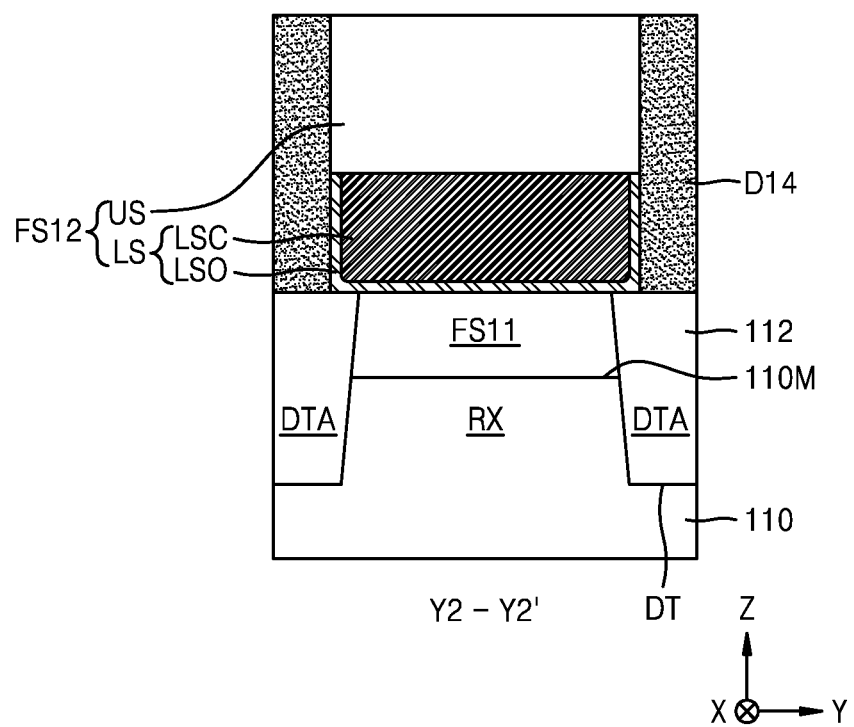

Referring to FIGS. 12A through 12C together, the gap-fill insulating layer 192 formed by the method described with reference to FIGS. 11A through 11C may be planarized to expose the top surface of the dummy gate line D14, in order to form the upper fin-isolation insulating portion US, which is a portion of the gap-fill insulating layer 192. The upper fin-isolation insulating portion US and the lower fin-isolation insulating portion LS may be included in the second fin-isolation insulating portion FS12.

Figure 13A:
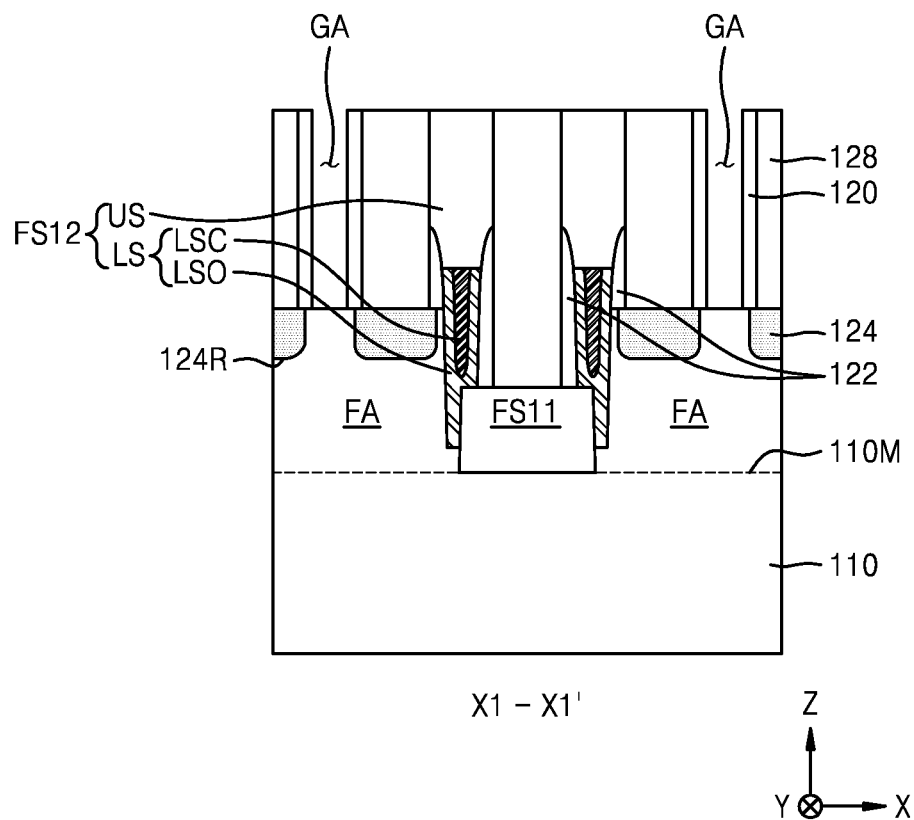
Figure 13B:
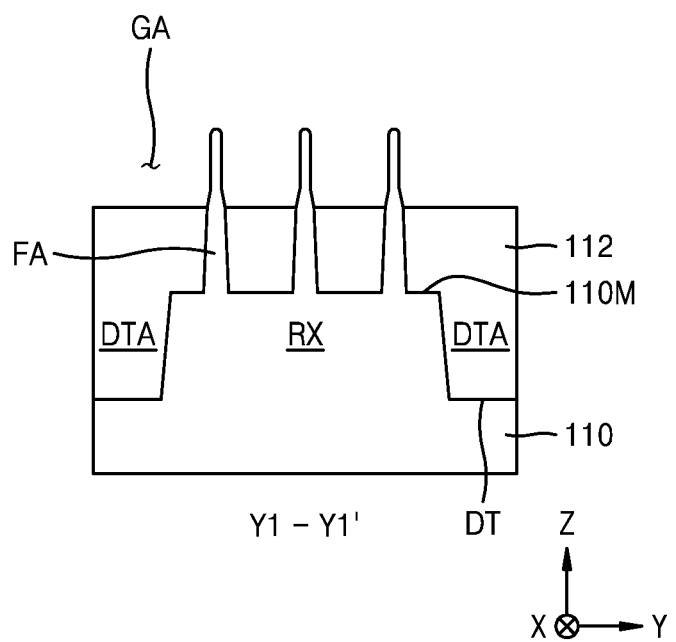
Figure 13C:
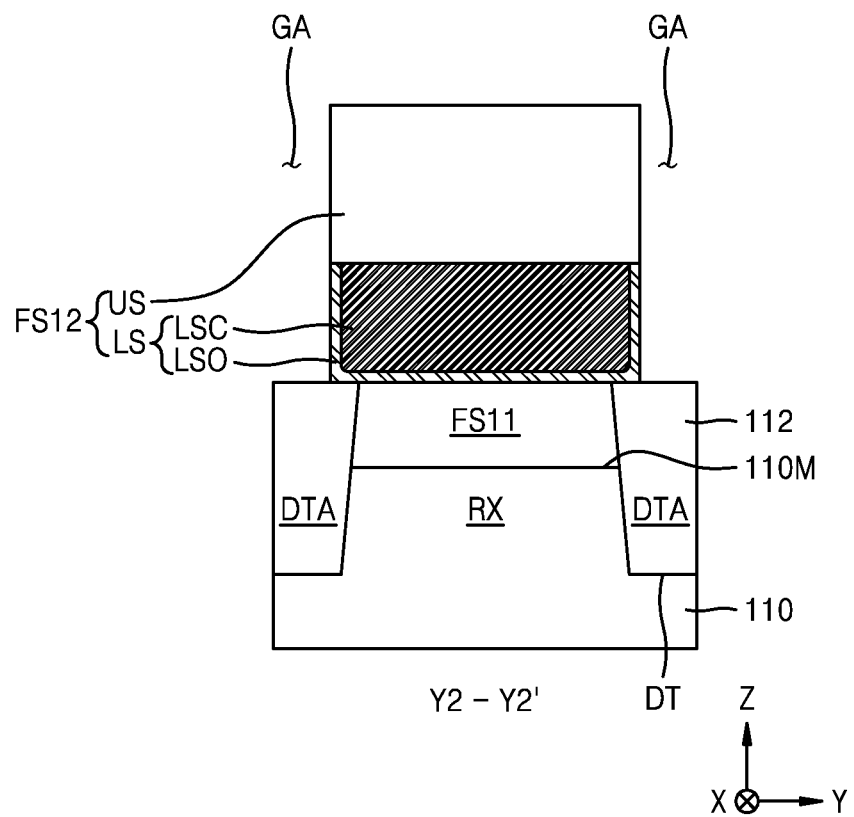

Referring to FIGS. 13A through 13C together, the dummy gate line D14 and the dummy gate insulating layer D12 may be removed from an object resulting from the method described with reference to FIGS. 12A through 12C, in order to form a plurality of gate structure spaces GA. The first insulating spacers 120, the fin-type active regions FA, and the element-isolation layer 112 may be exposed via the gate structure spaces GA.

Figure 14A:
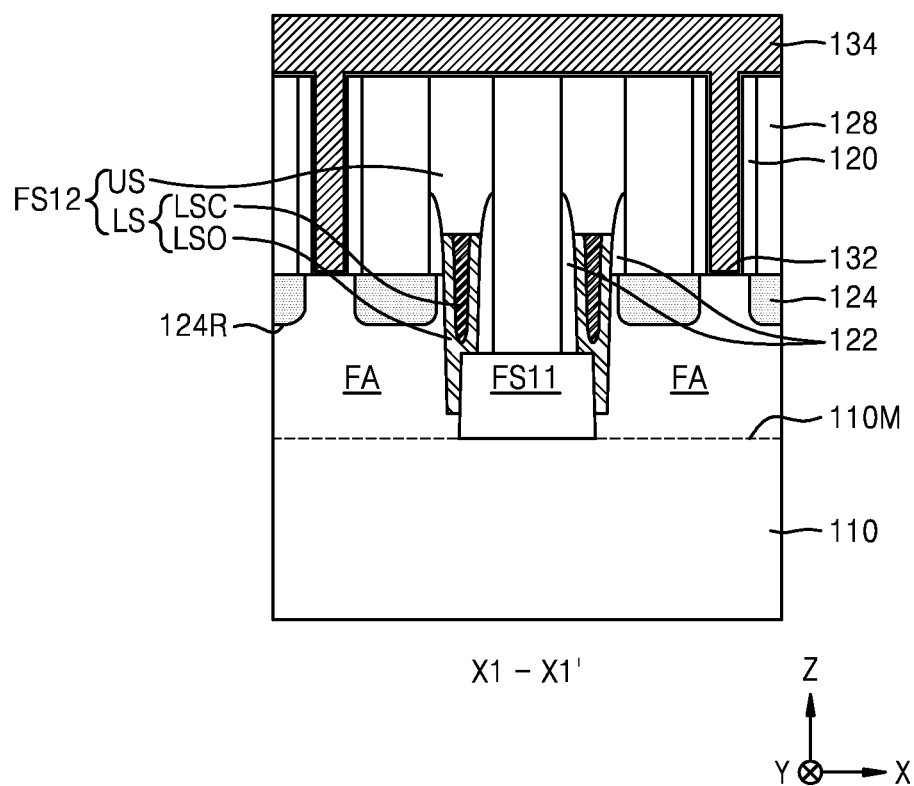
Figure 14B:
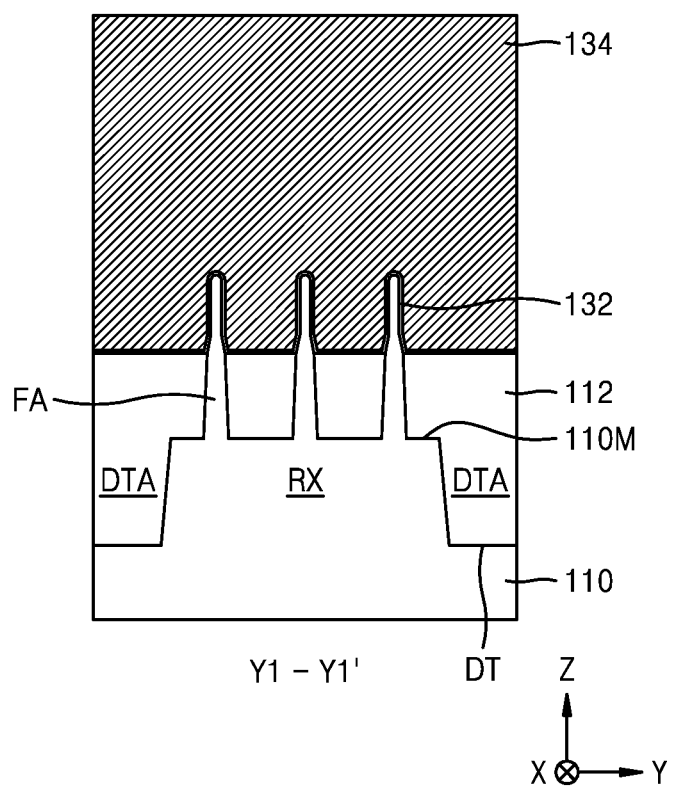
Figure 14C:
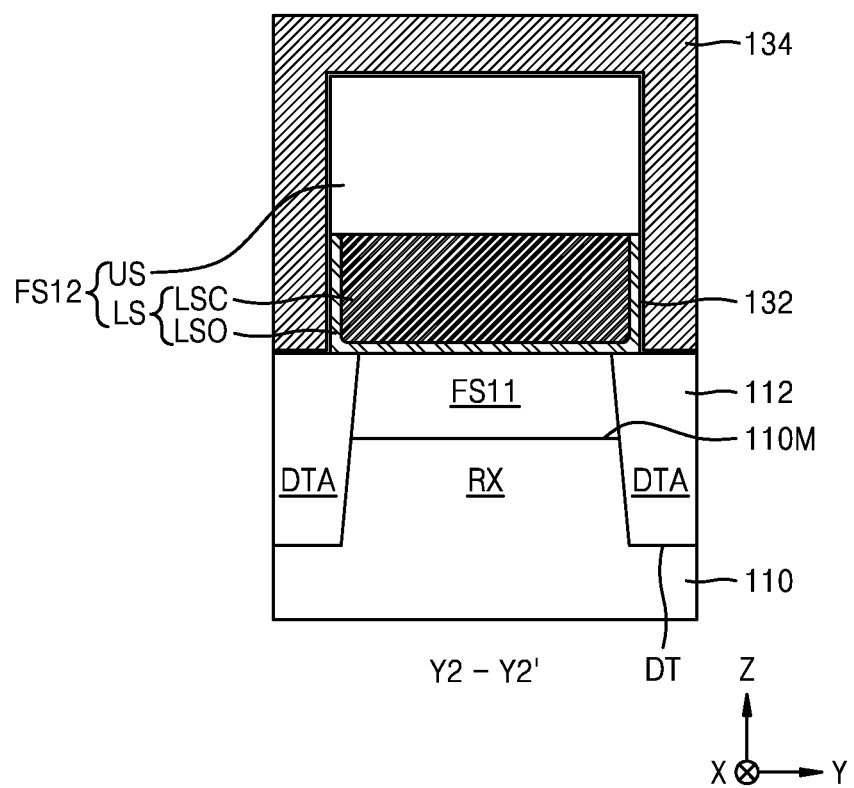

Referring to FIGS. 14A through 14C together, the gate insulating layer 132 and the gate conductive layer 134 may be formed in the plurality of gate structure spaces GA (refer to FIGS. 13A through 13C). Before forming the gate insulating layer 132, an interface layer may further be formed on a surface of the fin-type active regions FA, the surface being exposed via the plurality of gate structure spaces GA. The interface layer may be obtained by oxidizing a portion of the fin-type active regions FA, the portion being exposed in the plurality of gate structure spaces GA.

The gate insulating layer 132 and the gate conductive layer 134 may be formed to fill the inner space of the gate structure spaces GA and to cover a top surface of the inter-gate insulating layer 128. Each of the gate insulating layer 132 and the gate conductive layer 134 may be formed via an ALD process, a CVD process, a physical vapor deposition (PVD) process, a metal organic ALD (MOALD) process, or a metal organic CVD (MOCVD) process.

Figure 15A:
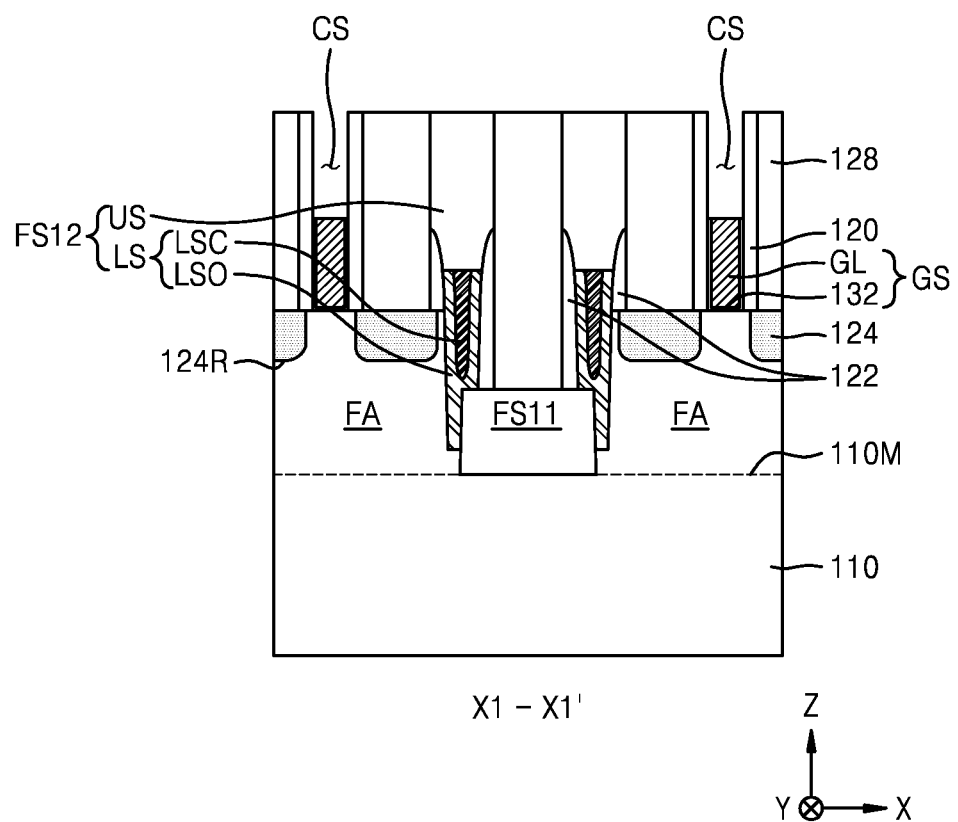
Figure 15B:
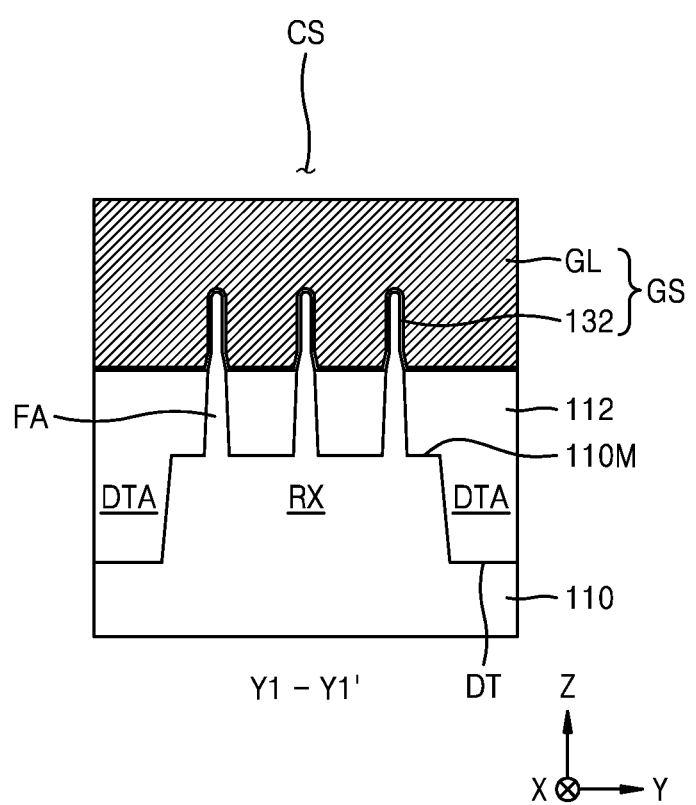
Figure 15C:
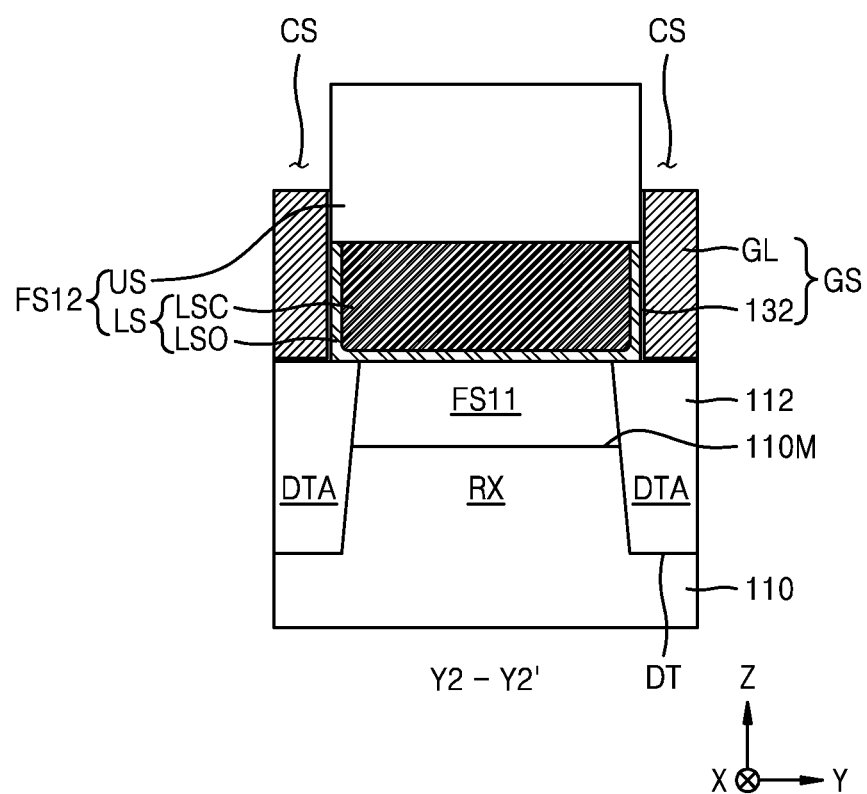

Referring to FIGS. 15A through 15C together, unnecessary portions of the gate insulating layer 132 and the gate conductive layer 134 (refer to FIGS. 14A through 14C) may be removed to expose the top surface of the inter-gate insulating layer 128, and upper portions of the gate insulating layer 132 and the gate conductive layer 134 may further be removed, to form a capping space CS. A portion of the gate conductive layer 134, which remains in the gate structure space GA (refer to FIGS. 13A through 13C), may form the gate line GL.

To remove the portion of the gate conductive layer 134, an etch selectivity between a metal layer and/or a metal containing layer included in the gate conductive layer 134, and a silicon oxide layer included in the inter-gate insulating layer 128 may be used. While the gate conductive layer 134 is removed by etching, the gate insulating layer 132 having a relatively less thickness may be removed together.

Figure 16A:
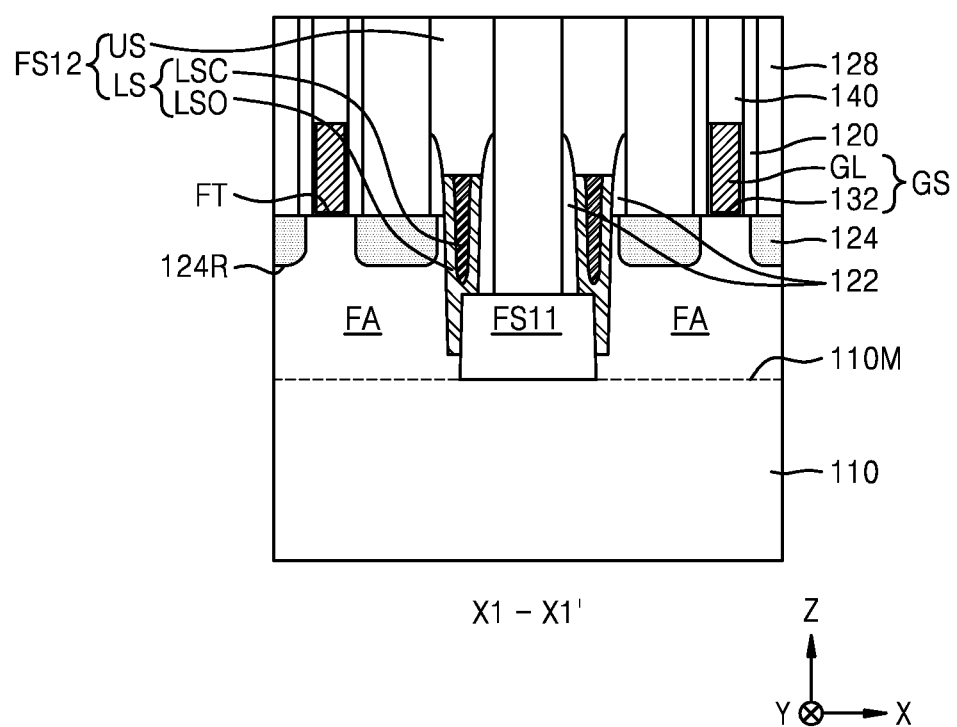
Figure 16B:
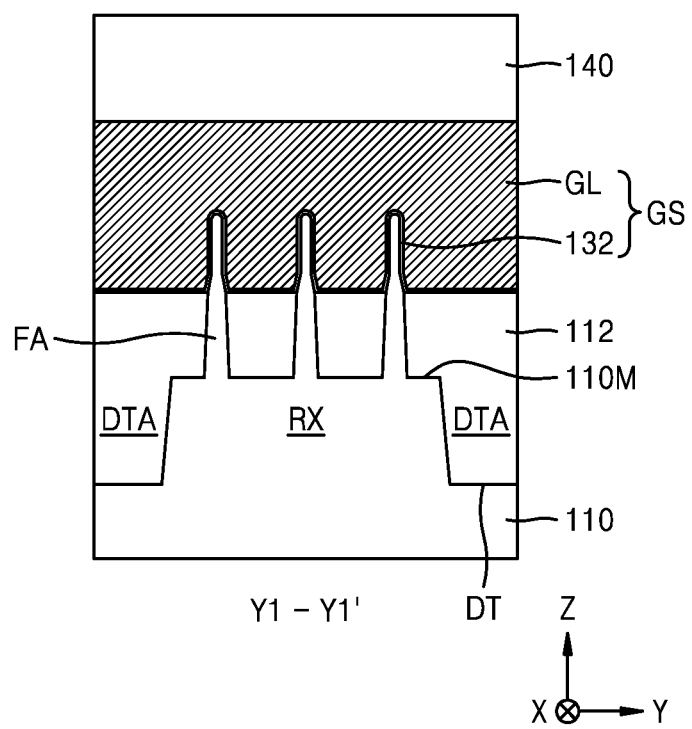
Figure 16C:
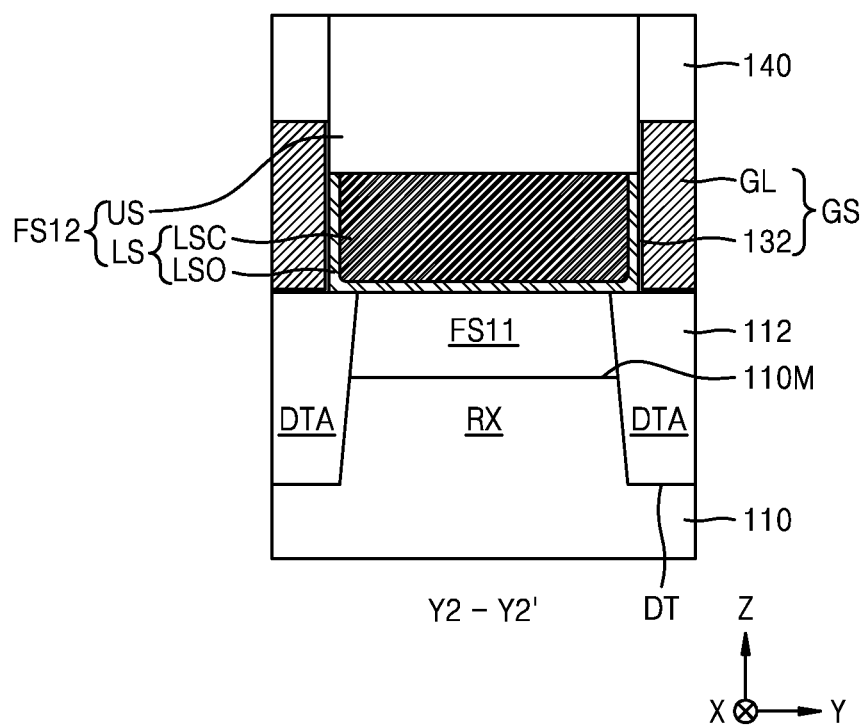

Referring to FIGS. 16A through 16C, the plurality of gate insulating capping layers 140 filling the plurality of capping spaces CS formed by the method described with reference to FIGS. 15A through 15C may be formed.

In order to form the gate insulating capping layer 140, a capping insulating layer having a sufficient thickness to fill the plurality of capping spaces CS may be formed on the substrate 110, and then, unnecessary portions of the capping insulating layer may be removed to expose a top surface of the inter-gate insulating layer 128. The gate insulating capping layer 140 may include a silicon nitride layer.

Thereafter, as illustrated in FIG. 2A, the insulating thin layer 150 and the interlayer insulating layer 160 covering the insulating thin layer 150 may be formed on an object resulting from the method described with reference to FIGS. 16A through 16C, and the plurality of conductive barrier layers 182 and the plurality of contact plugs 184 penetrating the interlayer insulating layer 160, the insulating thin layer 150, and the inter-gate insulating layer 128 and connected to the plurality of source/drain regions 124 may be formed, to form the integrated circuit device 100.

In some embodiments, the insulating thin layer 150 may include a material different from the gate insulating capping layer 140. For example, when the gate insulating capping layer 140 includes a silicon nitride layer, the insulating thin layer 150 may include a silicon oxide layer. However, the inventive concepts are not limited thereto. For example, the insulating thin layer 150 may include a silicon oxide layer, a silicon nitride layer, a polysilicon layer, or a combination thereof. The interlayer insulating layer 160 may include a silicon oxide layer, a silicon nitride layer, or a combination thereof.

FIGS. 17A through 17D are cross-sectional views illustrated in a process order for describing a method of manufacturing an integrated circuit device, according to embodiments. In detail, each of FIGS. 17A through 17D is the cross-sectional view of a portion corresponding to the line X1-X1' of FIG. 1 for describing the method of manufacturing the integrated circuit device 100a of FIG. 2B.

Figure 17A:
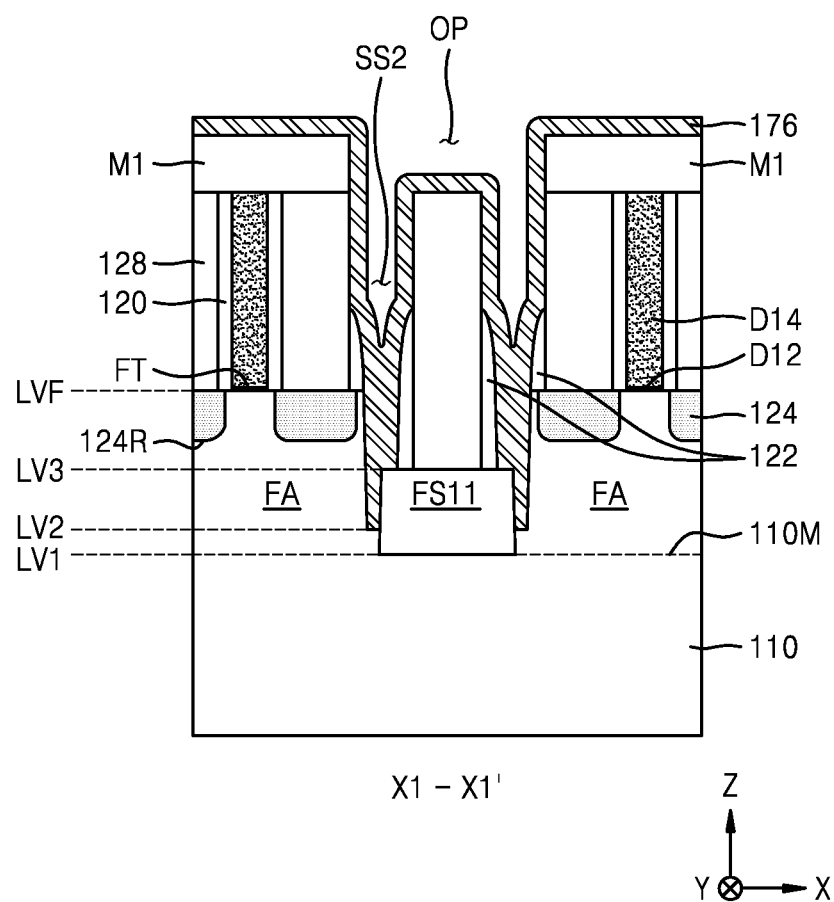
FIGS. 17A through 17D are cross-sectional views for describing a method of manufacturing an integrated circuit device, according to embodiments, the cross-sectional views being illustrated in a sequential order of the method.

Referring to FIG. 17A, a lower fin-isolation insulating layer 176 conformally covering an inner surface of the second fin-isolation spaces SS2 formed by the method described with reference to FIGS. 7A through 7C may be formed. The lower fin-isolation insulating layer 176 may cover both a top surface and a side surface of the mask pattern M1. The lower fin-isolation insulating layer 176 may include, for example, a nitride layer or an oxide layer. The lower fin-isolation insulating layer 176 may be formed by using an ALD process. The lower fin-isolation insulating layer 176 may be formed to fill a lower portion of the second fin-isolation spaces SS2. The lower fin-isolation insulating layer 176 may fill from a bottom surface of the second fin-isolation spaces SS2 to a level higher than the vertical level LVF of the uppermost surface FT of the fin-type active regions FA.

Figure 17B:
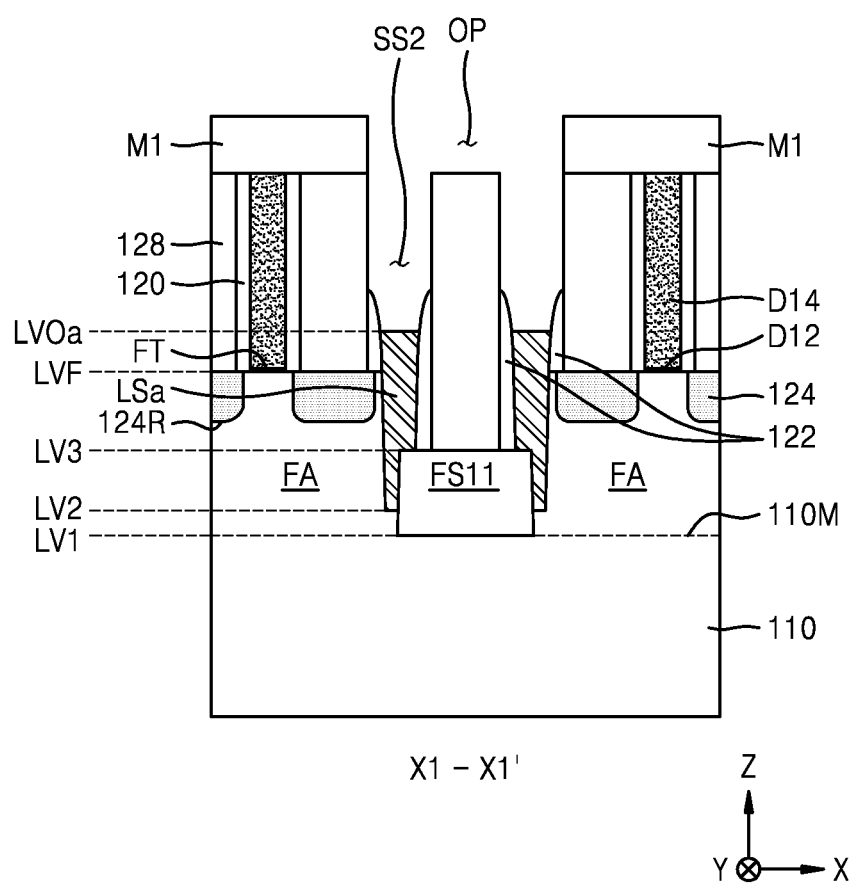

Referring to FIG. 17B, an upper portion of the lower fin-isolation insulating layer 176 formed by the method described with reference to FIG. 17A may be removed to form the lower fin-isolation insulating portion LSa. In order to form the lower fin-isolation insulating portion LSa, the upper portion of the lower fin-isolation insulating layer 176 may be removed by using a wet etch process and a dry etch process.

The vertical level LVOa of the uppermost surface of the lower fin-isolation insulating portion LSa may be higher than the vertical level LVF of the uppermost surface FT of the fin-type active regions FA and may be lower than the vertical level of the uppermost surface of the dummy gate line D14.

Figure 17C:
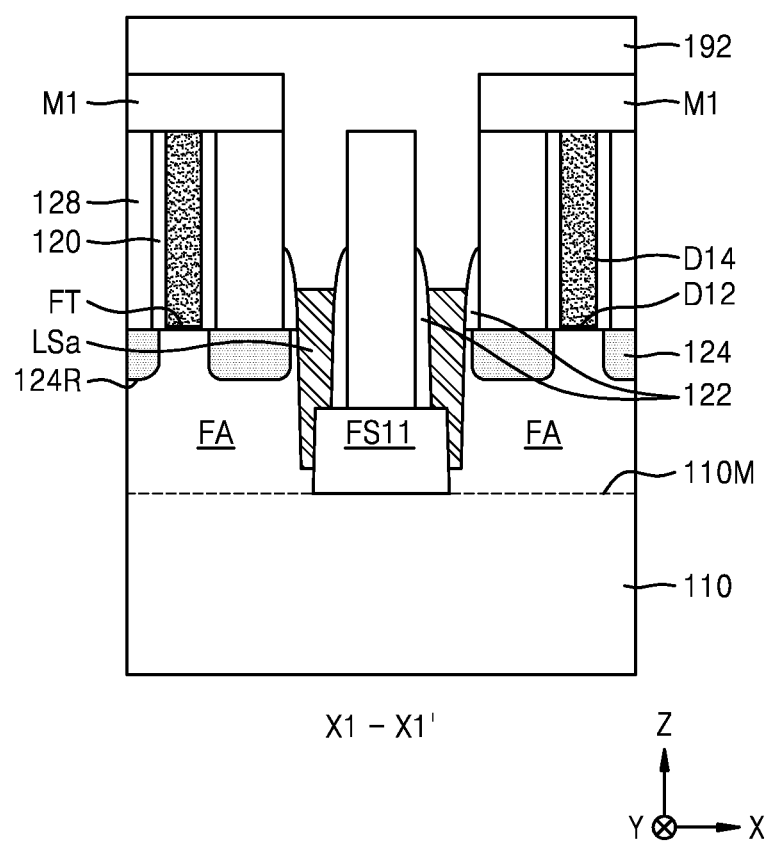

Referring to FIG. 17C, the gap-fill insulating layer 192 filling all of the second fin-isolation spaces SS2 may be formed on an object resulting from the method described with reference to FIG. 17B. The gap-fill insulating layer 192 may be formed to fill all of the second fin-isolation spaces SS2 and to cover both the top surface and the side surface of the mask pattern M1.

Figure 17D:
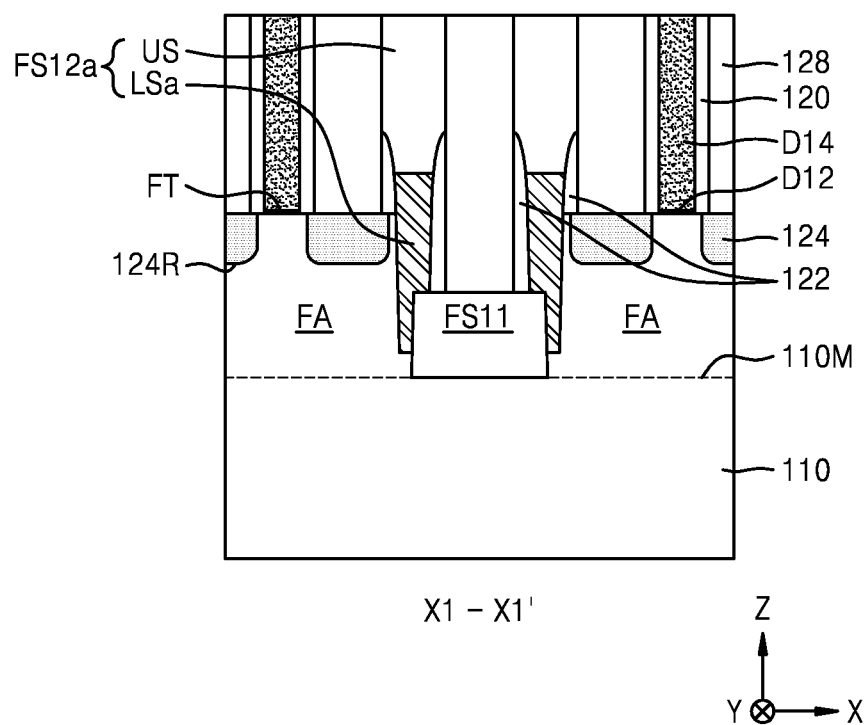

Referring to FIG. 17D, the gap-fill insulating layer 192 formed by the method described with reference to FIG. 17C may be planarized to expose the top surface of the dummy gate line D14, to form the upper fin-isolation insulating portion US. The upper fin-isolation insulating portion US and the lower fin-isolation insulating portion LSa may together form the fin-isolation insulating portion FSa.

Thereafter, the manufacturing method described with reference to FIGS. 13A through 16C may be performed to form the integrated circuit device 100a illustrated in FIG. 2B.

Figure 18:
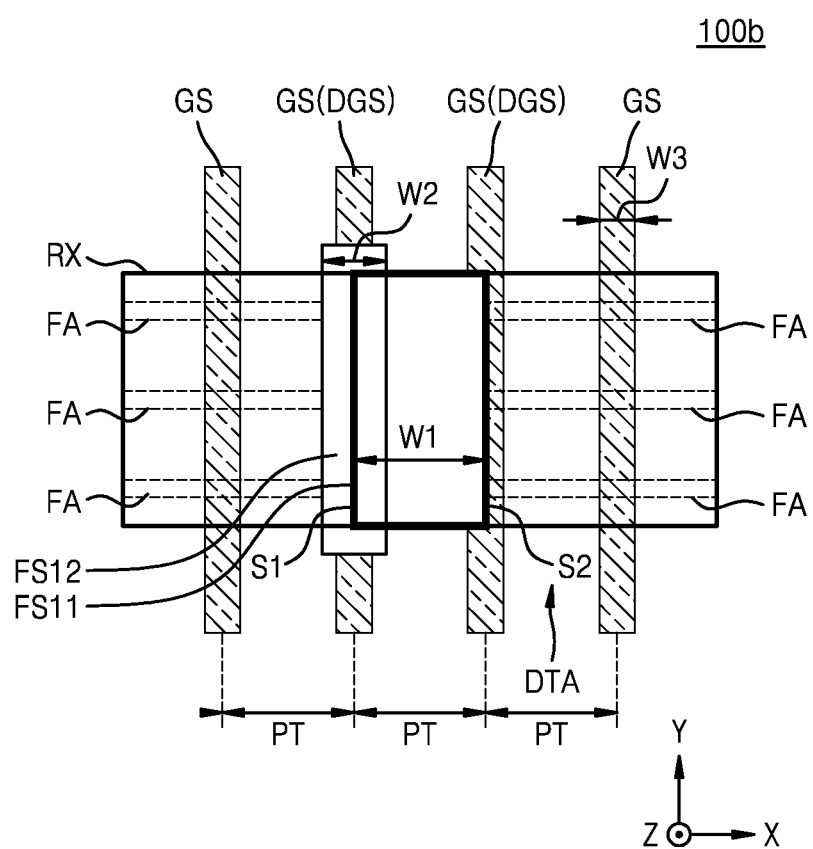
FIG. 18 is a planar layout diagram for describing an integrated circuit device according to embodiments.
Figure 19A:
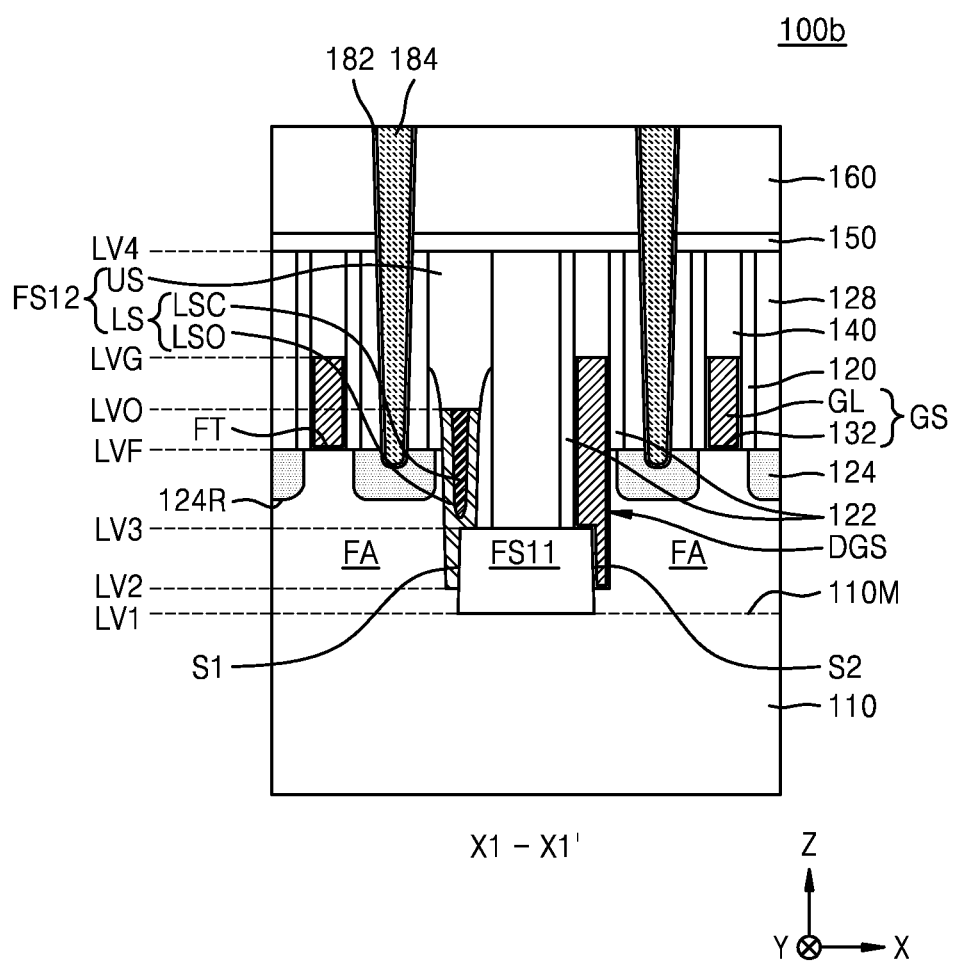
FIGS. 19A and 19B are cross-sectional views for describing an integrated circuit device according to embodiments.
Figure 19B:
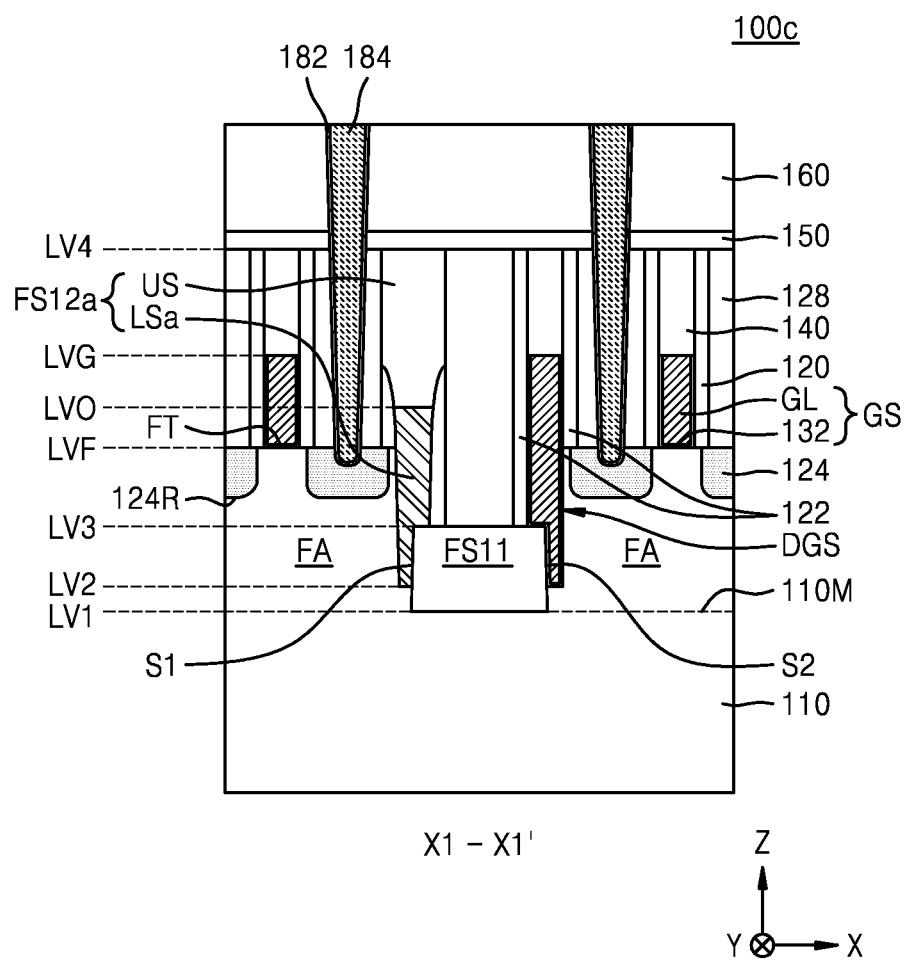

FIG. 18 is a planar layout diagram for describing an integrated circuit device 100b according to other embodiments, and FIGS. 19A and 19B are cross-sectional views for describing integrated circuit devices 100b and 100c according to embodiments. Like reference numerals in FIGS. 1 through 2B refer to like elements in FIGS. 18 through 19B, and thus, their detailed descriptions will be omitted.

Referring to FIGS. 18 and 19A together, in the integrated circuit device 100b, the first fin-isolation insulating portion FS11 and the plurality of second fin-isolation insulating portions FS12 may be disposed in the element region RX. The first fin-isolation insulating portion FS11 may include the first side wall S1 and the second side wall S2 each facing the opposite side in the first direction (the direction X). In the element region RX, the second fin-isolation insulating portions FS12 may contact the first side wall S1 of the first fin-isolation insulating portion FS11, and the dummy gate structure DGS may contact the second side wall S2 of the first fin-isolation insulating portion FS11. A portion of one or more of the second fin-isolation insulating portions FS12 may vertically overlap a portion of the first fin-isolation insulating portion FS11, and one or more of the dummy gate structures DGS may vertically overlap a portion of the first fin-isolation insulating portion FS11, wherein the portion of the first fin-isolation insulating portion FS11 that the portion of the one or more of the second fin-isolation insulating portions FS12 may vertically overlap is different from the portion of the first fin-isolation insulating portion FS11 that the one or more of the dummy gate structures DGS may vertically overlap.

The first fin-isolation insulating portion FS11 and the second fin-isolation insulating portions FS12 may be disposed between the gate structures GS in the element region RX. One first fin-isolation insulating portion FS11 and one second fin-isolation insulating portion FS12 may be disposed between two gate structures GS in the first direction (the direction X) in the element region RX.

A pair of dummy gate structures DGS extending in a straight line along the first side wall S1 may be disposed at both external sides of the element region RX in the second direction (the direction Y) with one second fin-isolation insulating portion FS12 therebetween. The dummy gate structures DGS contacting the second side wall S2 may extend at both sides of the first fin-isolation insulating portion FS11 in a straight line along the second side wall S2.

Referring to FIG. 19B, in the integrated circuit device 100c, the first fin-isolation insulating portion FS11 and a plurality of second fin-isolation insulating portions FS12a may be disposed in the element region RX. The first fin-isolation insulating portion FS11 may include the first side wall S1 and the second side wall S2 each facing the opposite side in the first direction (the direction X). In the element region RX, the second fin-isolation insulating portions FS12a may contact the first side wall S1 of the first fin-isolation insulating portion FS11, and the dummy gate structure DGS may contact the second side wall S2 of the first fin-isolation insulating portion FS11. A portion of one or more of the second fin-isolation insulating portions FS12a may vertically overlap a portion of the first fin-isolation insulating portion FS11, and one or more of the dummy gate structure DGS may vertically overlap a portion of the first fin-isolation insulating portion FS11, wherein the portion of the first-fin isolation insulating portion FS11 that the portion of the one or more of the second fin-isolation insulating portions FS12a may vertically overlap is different from the portion of the first fin-isolation insulating portion FS11 that the one or more of the dummy gate structures DGS may vertically overlap.

A pair of dummy gate structures DGS extending in a straight line along the first side wall S1 may be disposed at both external sides of the element region RX in the second direction (the direction Y) with one second fin-isolation insulating portion FS12a therebetween. The dummy gate structures DGS contacting the second side wall S2 may extend at both sides of the first fin-isolation insulating portion FS11 in a straight line along the second side wall S2.

Figure 20A:
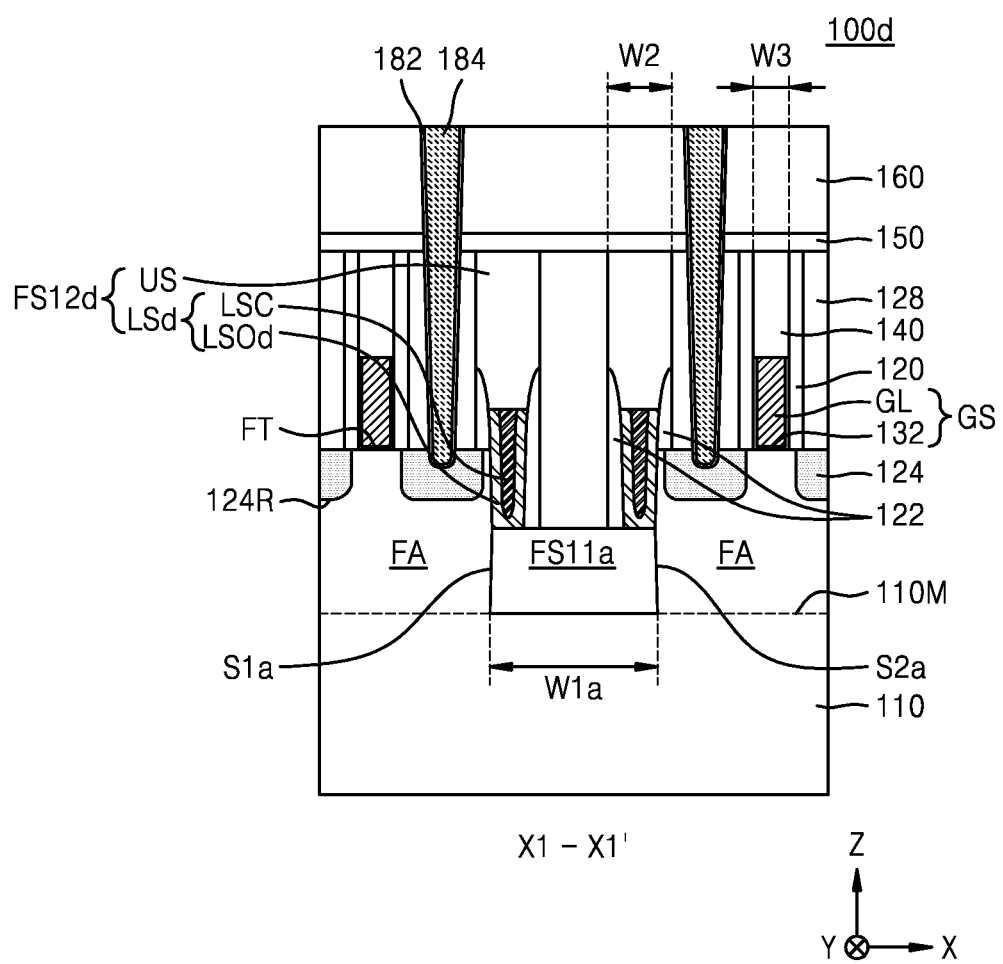
FIGS. 20A and 20B are cross-sectional views for describing an integrated circuit device according to embodiments.
Figure 20B:
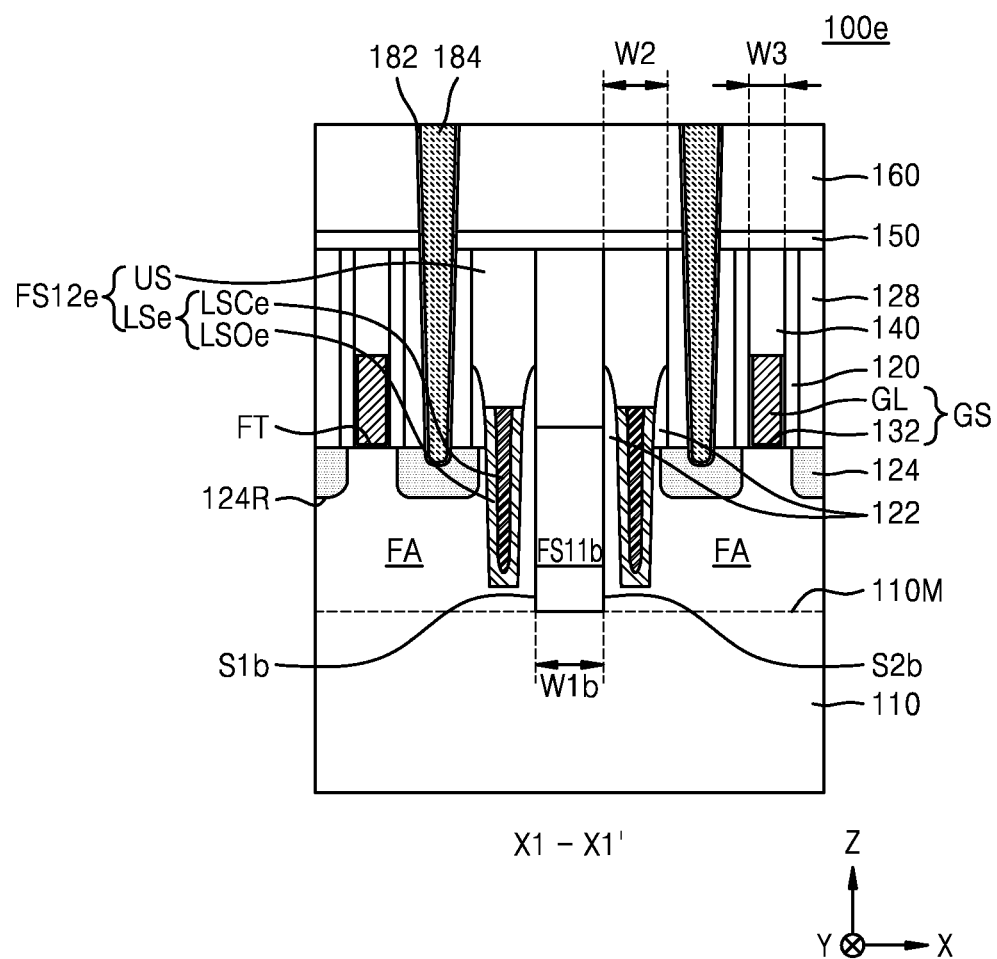

FIGS. 20A and 20B are cross-sectional views for describing integrated circuit devices 100d and 100e according to embodiments. Like reference numerals in FIGS. 1 and 2A refer to like elements in FIGS. 20A and 20B, and thus, their detailed descriptions will be omitted.

Referring to FIG. 20A, the integrated circuit device 100d may include a first fin-isolation insulating portion FS11a and a plurality of second fin-isolation insulating portions FS12d. The first fin-isolation insulating portion FS11a may include a first side wall S1a and a second side wall S2a each facing the opposite side in the first direction (the direction X). A pair of second fin-isolation insulating portions FS12d may be adjacent to the first side wall S1a and the second side wall S2a of the first fin-isolation insulating portion FS11a, respectively. Bottom surfaces of the pair of second fin-isolation insulating portions FS12d may be adjacent to the first side wall S1a and the second side wall S2a of the first fin-isolation insulating portion FS11a, respectively, thereby contacting an upper surface of the first fin-isolation insulating portion FS11a.

The first fin-isolation insulating portion FS11a may have a first width W1a in the first direction (the direction X). The first width W1a of the first fin-isolation insulating portion FS11a may be greater than the first width W1 of the first fin-isolation insulating portion FS11 illustrated in FIG. 2A.

The second fin-isolation insulating portion FS12d may include a lower fin-isolation insulating portion LSd and the upper fin-isolation insulating portion US located on the lower fin-isolation insulating portion LSd. The lower fin-isolation insulating portion LSd may include the core insulating pattern LSC and a peripheral insulating pattern LSOd covering side surfaces and a bottom surface of the core insulating pattern LSC. The core insulating pattern LSC and the peripheral insulating pattern LSOd may include a different material from each other. In some embodiments, the lower fin-isolation insulating portion LSd may be formed to have a single-layered structure including a single material.

Referring to FIG. 20B, the integrated circuit device 100e may include a first fin-isolation insulating portion FS11b and a plurality of second fin-isolation insulating portions FS12e. The first fin-isolation insulating portion FS11b may include a first side wall S1b and a second side wall S2b each facing the opposite side in the first direction (the direction X). A pair of second fin-isolation insulating portions FS12e may be adjacent to the first side wall S1b and the second side wall S2b of the first fin-isolation insulating portion FS11b, respectively. The pair of second fin-isolation insulating portions FS12e may be spaced apart from the first side wall S1b and the second side wall S2b of the first fin-isolation insulating portion FS11b, respectively.

The first fin-isolation insulating portion FS11b may have a first width W1b in the first direction (the direction X). The first width W1b of the first fin-isolation insulating portion FS11b may be less than the first width W1 of the first fin-isolation insulating portion FS11 illustrated in FIG. 2A.

The second fin-isolation insulating portion FS12e may include a lower fin-isolation insulating portion LSe and the upper fin-isolation insulating portion US located on the lower fin-isolation insulating portion LSe. The lower fin-isolation insulating portion LSe may include a core insulating pattern LSCe and a peripheral insulating pattern LSOe covering side surfaces and a bottom surface of the core insulating pattern LSCe. The core insulating pattern LSCe and the peripheral insulating pattern LSOd may include a different material from each other. In some embodiments, the lower fin-isolation insulating portion LSe may be formed to have a single-layered structure including a single material.

Figure 21A:
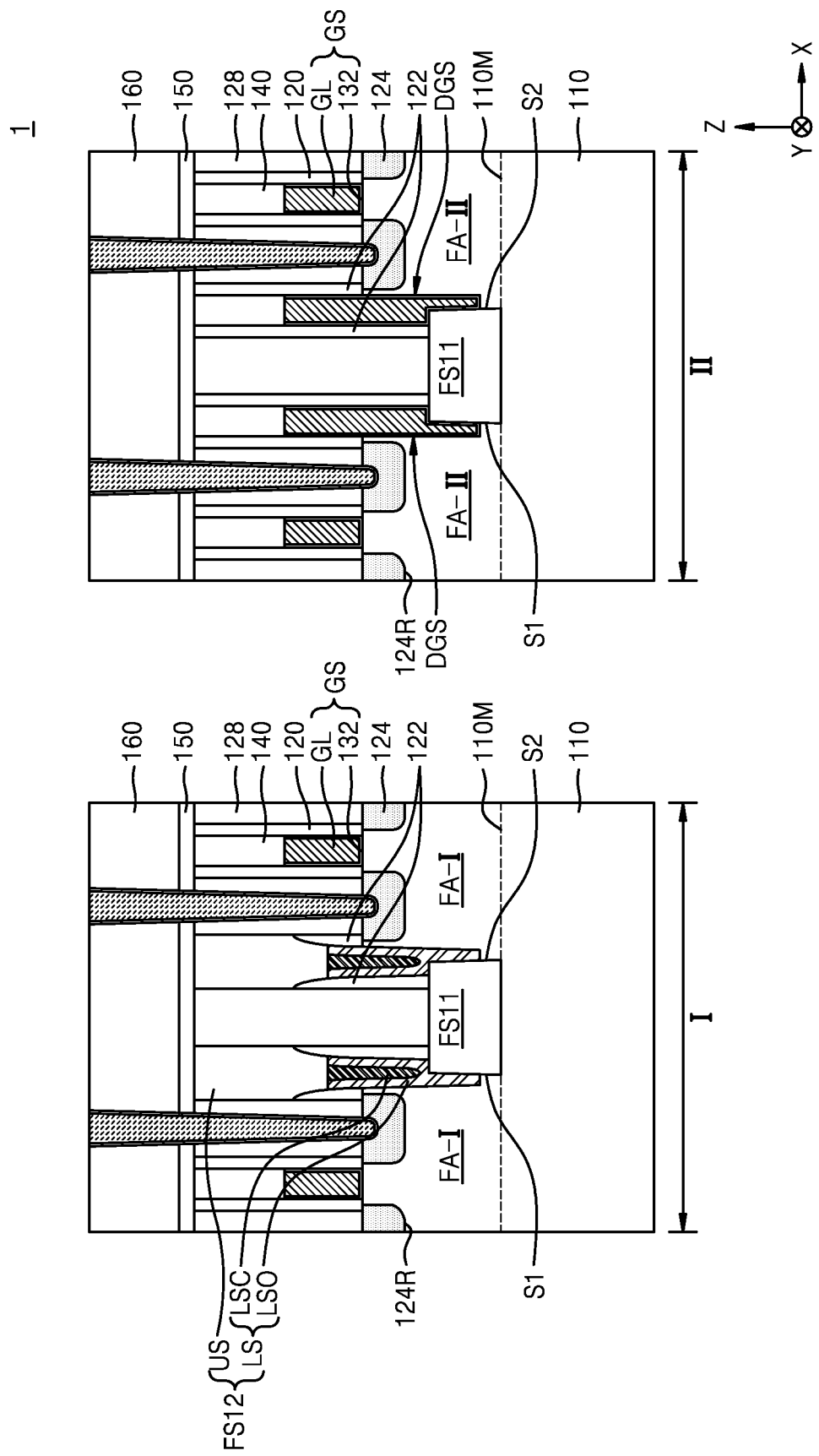
FIGS. 21A and 21B are cross-sectional views for describing an integrated circuit device according to embodiments.
Figure 21B:
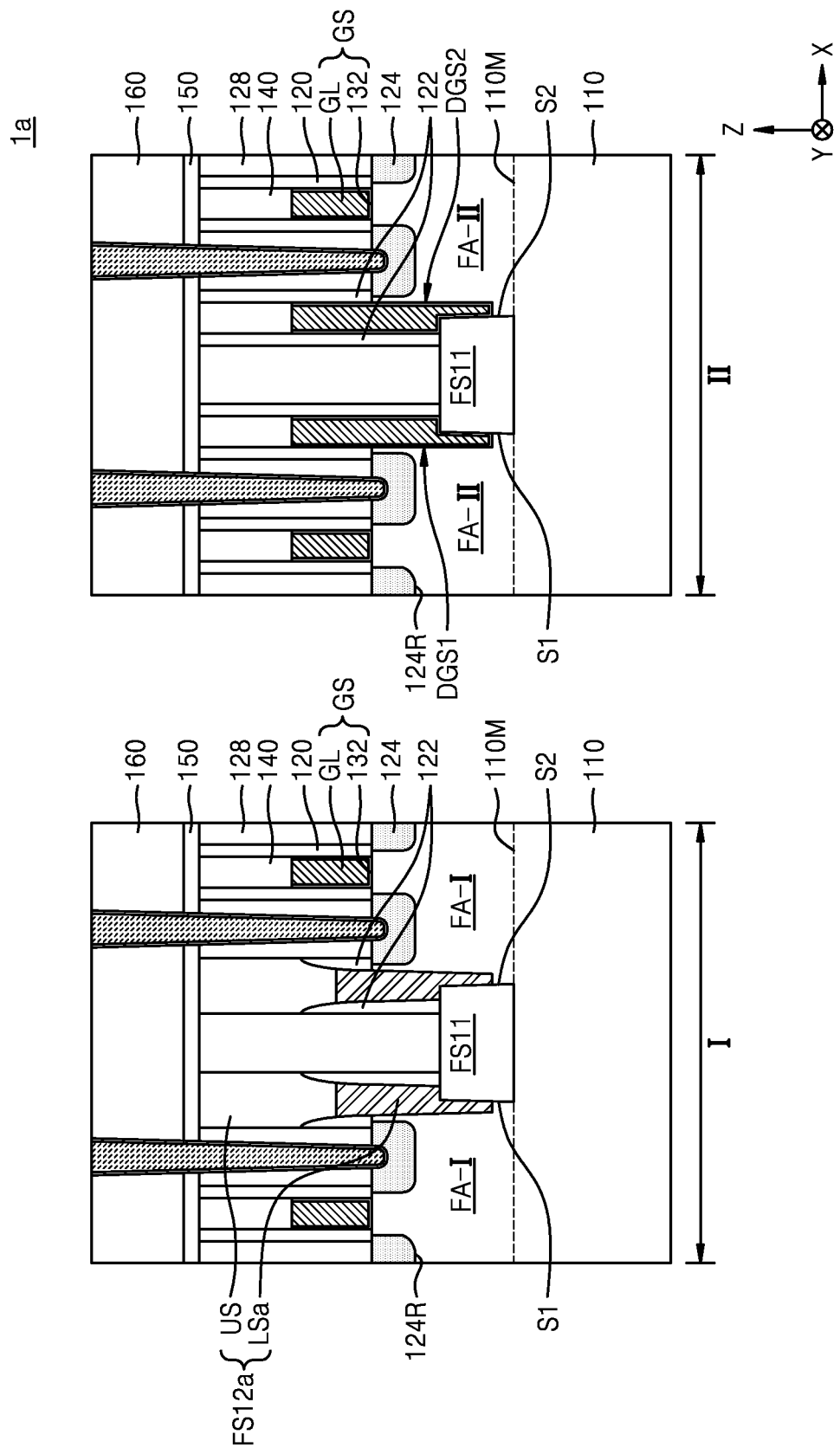

FIGS. 21A and 21B are cross-sectional views for describing integrated circuit devices 1 and 1a according to embodiments. Like reference numerals in FIGS. 1 through 2B refer to like elements in FIGS. 21A and 21B, and thus, their detailed descriptions will be omitted.

Referring to FIG. 21A, the integrated circuit device 1 may have a first region I and a second region II.

MOS transistors having a 3D structure in which different conductive-type channels are formed along the plurality of gate structures GS may be formed in each of a plurality of fin-type active regions FA-I in the first region I and a plurality of fin-type active regions FA-II in the second region II. For example, a plurality of pMOS transistors may be formed along the plurality of gate structures GS in the first region I, and a plurality of nMOS transistors may be formed along the plurality of gate structures GS in the second region II. Alternatively, for example, a plurality of nMOS transistors may be formed along the plurality of gate structures GS in the first region I, and a plurality of pMOS transistors may be formed along the plurality of gate structures GS in the second region II.

In some embodiments, MOS transistors having a 3D structure in which the same conductive-type channels are formed along the plurality of gate structures GS, the same conductive-type channels having different characteristics, may be formed in each of the plurality of fin-type active regions FA-I in the first region I and the plurality of fin-type active regions FA-II in the second region II. Alternatively, for example, the plurality of MOS transistors formed along the plurality of gate structures GS in the first region I and the plurality of MOS transistors formed along the plurality of gate structures GS in the second region II may have a different operational speed and/or a different operational voltage from each other.

The first side wall S1 and the second side wall S2 of the first fin-isolation insulating portion FS11 in the first region I may contact the different second fin-isolation insulating portions FS12.

The first side wall S1 and the second side wall S2 of the first fin-isolation insulating portion FS11 in the second region II may contact the different dummy gate structures DGS.

According to the integrated circuit device 1, the second fin-isolation insulating portion FS12 may be formed in the first region I and may not be formed in the second region II. Thus, the integrated circuit device 1 may separately and finely control the characteristics of the MOS transistors formed in the first region I and the MOS transistors formed in the second region II, and thus, may provide improved or optimum performance.

Referring to FIG. 21B, the integrated circuit device 1a may have the first region I and the second region II.

The first side wall S1 and the second side wall S2 of the first fin-isolation insulating portion FS11 in the first region I may contact the different second fin-isolation insulating portions FS12a.

The first side wall S1 and the second side wall S2 of the first fin-isolation insulating portion FS11 in the second region II may contact the different dummy gate structures DGS.

According to the integrated circuit device 1a, the second fin-isolation insulating portion FS12a may be formed in the first region I and may not be formed in the second region II. Thus, the integrated circuit device 1a may separately and finely control the characteristics of the MOS transistors formed in the first region I and the MOS transistors formed in the second region II, and thus, may provide improved or optimum performance.

Figure 22A:
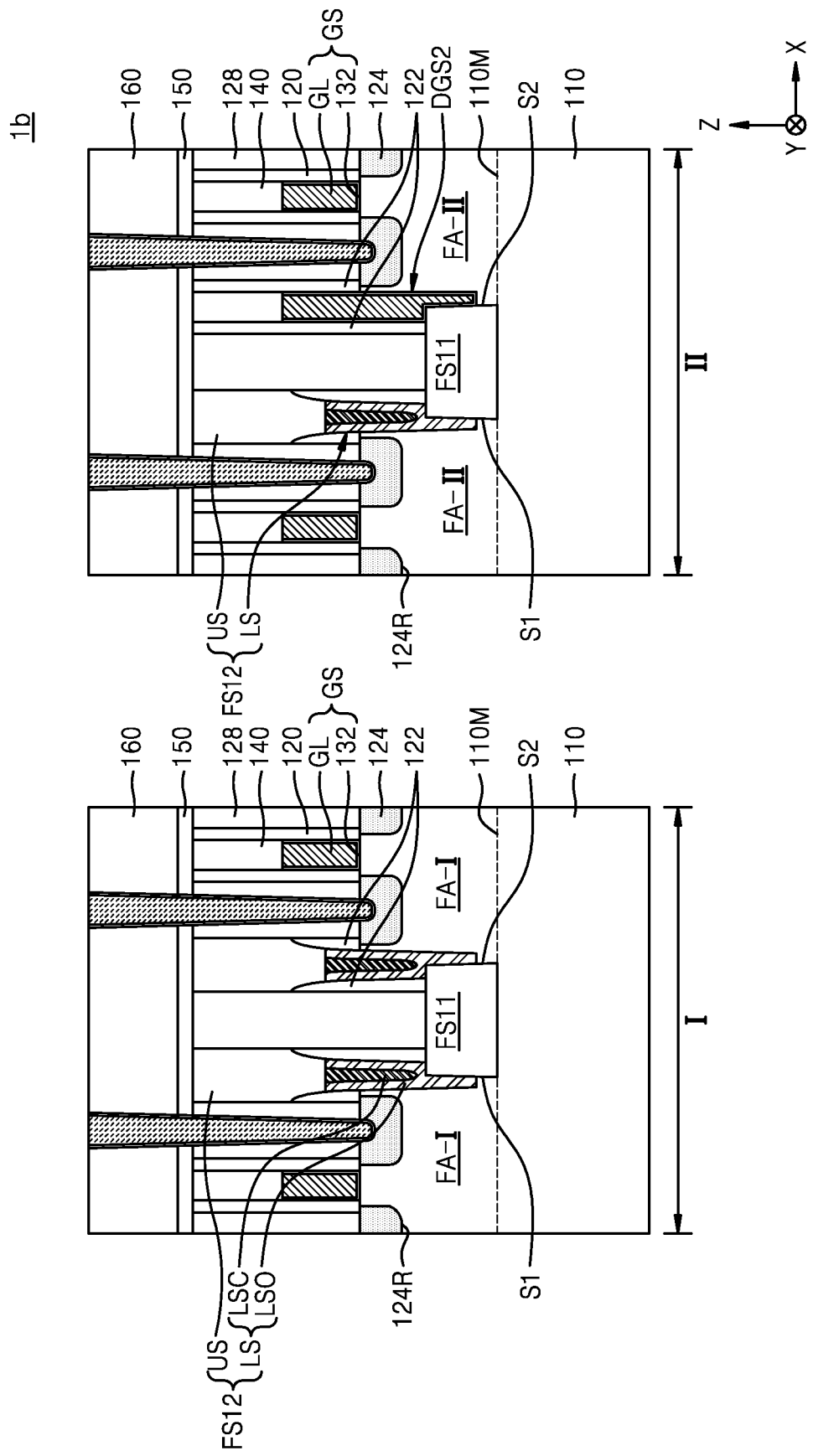
FIGS. 22A and 22B are cross-sectional views for describing an integrated circuit device according to embodiments.
Figure 22B:
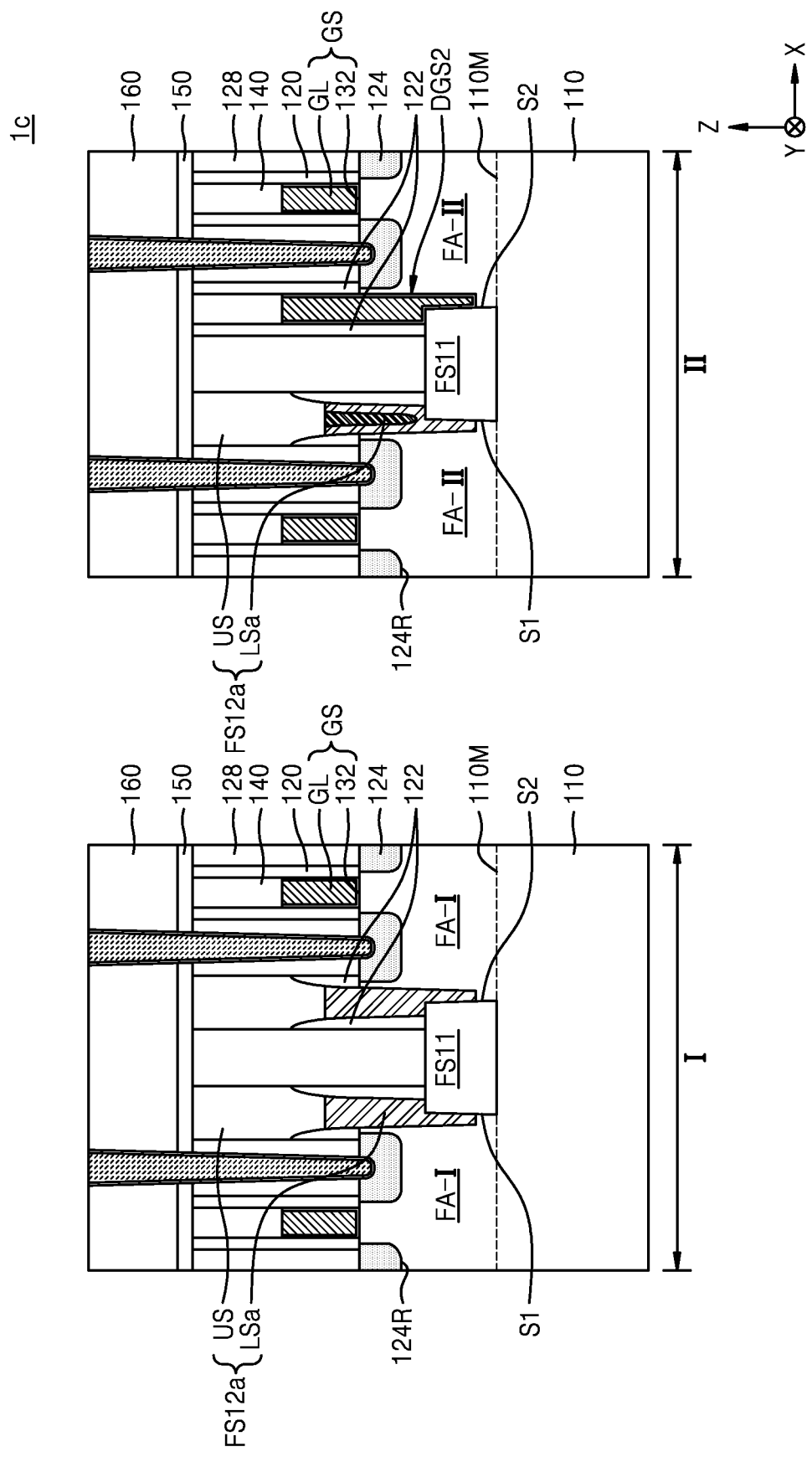

FIGS. 22A and 22B are cross-sectional views for describing integrated circuit devices 1b and 1c according to embodiments. Like reference numerals in FIGS. 1 through 2B, and 18 through 19B refer to like elements in FIGS. 22A and 22B, and thus, their detailed descriptions will be omitted.

Referring to FIG. 22A, the integrated circuit device 1b may have the first region I and the second region II.

The first side wall S1 and the second side wall S2 of the first fin-isolation insulating portion FS11 in the first region I may contact the different second fin-isolation insulating portions FS12.

The first side wall S1 and the second side wall S2 of the first fin-isolation insulating portion FS11 in the second region II may contact the second fin-isolation insulating portion FS12 and the dummy gate structures DGS, respectively.

According to the integrated circuit device 1b, the second fin-isolation insulating portion FS12 may be formed in the first region I to contact the first side wall S1 and the second side wall S2 of the first fin-isolation insulating portion FS11 and may be formed in the second region II to contact only the first side wall S1 of the first fin-isolation insulating portion FS11. Thus, the integrated circuit device 1b may separately and finely control the characteristics of the MOS transistors formed in the first region I and the MOS transistors formed in the second region II, and thus, may provide improved or optimum performance.

Referring to FIG. 22B, the integrated circuit device 1c may have the first region I and the second region II.

The first side wall S1 and the second side wall S2 of the first fin-isolation insulating portion FS11 in the first region I may contact the different second fin-isolation insulating portions FS12a.

The first side wall S1 and the second side wall S2 of the first fin-isolation insulating portion FS11 in the second region II may contact the second fin-isolation insulating portion FS12a and the dummy gate structures DGS, respectively.

According to the integrated circuit device 1c, the second fin-isolation insulating portion FS12a may be formed in the first region I to contact the first side wall S1 and the second side wall S2 of the first fin-isolation insulating portion FS11 and may be formed in the second region II to contact only the first side wall S1 of the first fin-isolation insulating portion FS11. Thus, the integrated circuit device 1c may separately and finely control the characteristics of the MOS transistors formed in the first region I and the MOS transistors formed in the second region II, and thus, may provide improved or optimum performance.

Figure 23A:
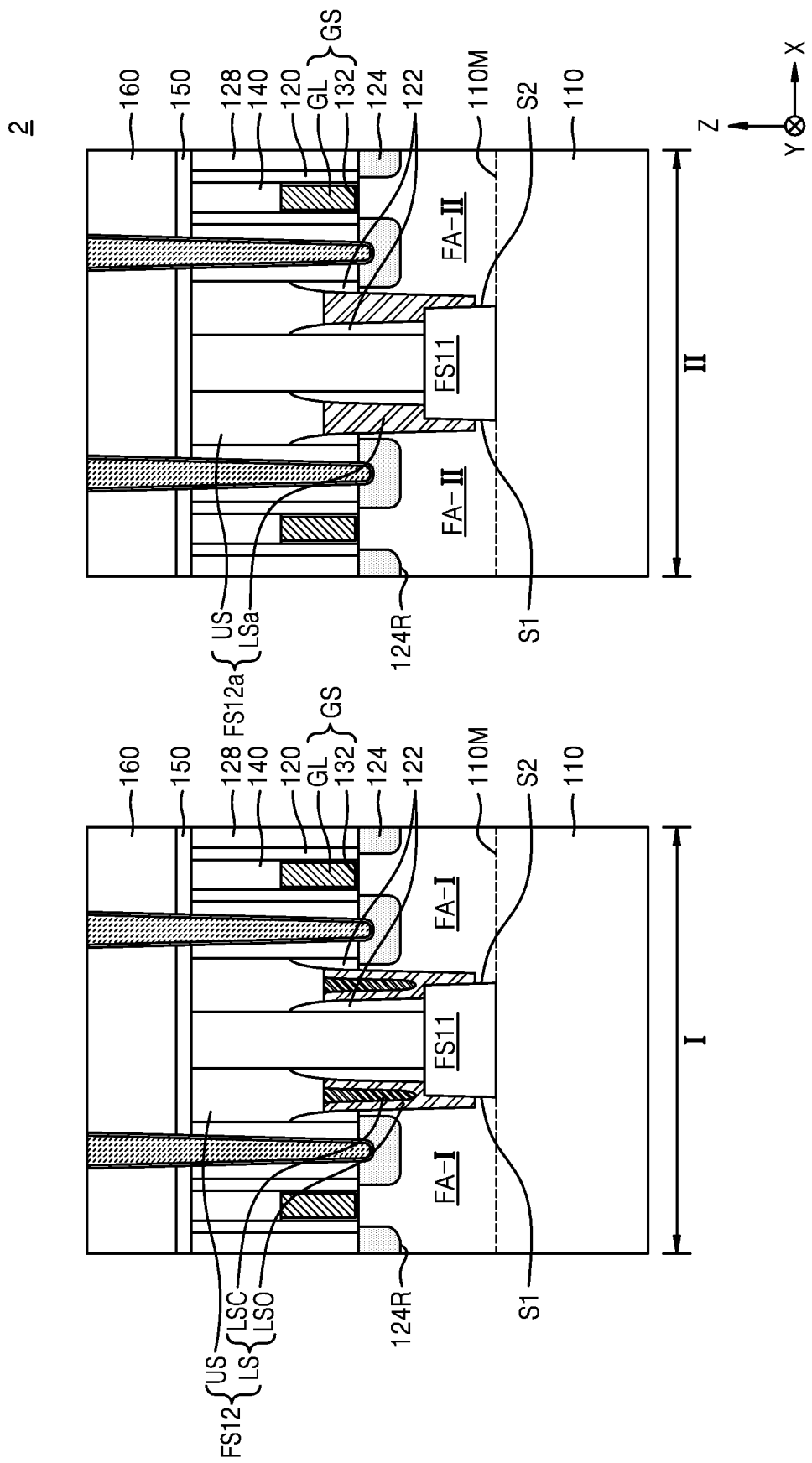
FIGS. 23A through 23C are cross-sectional views for describing an integrated circuit device according to embodiments.
Figure 23B:
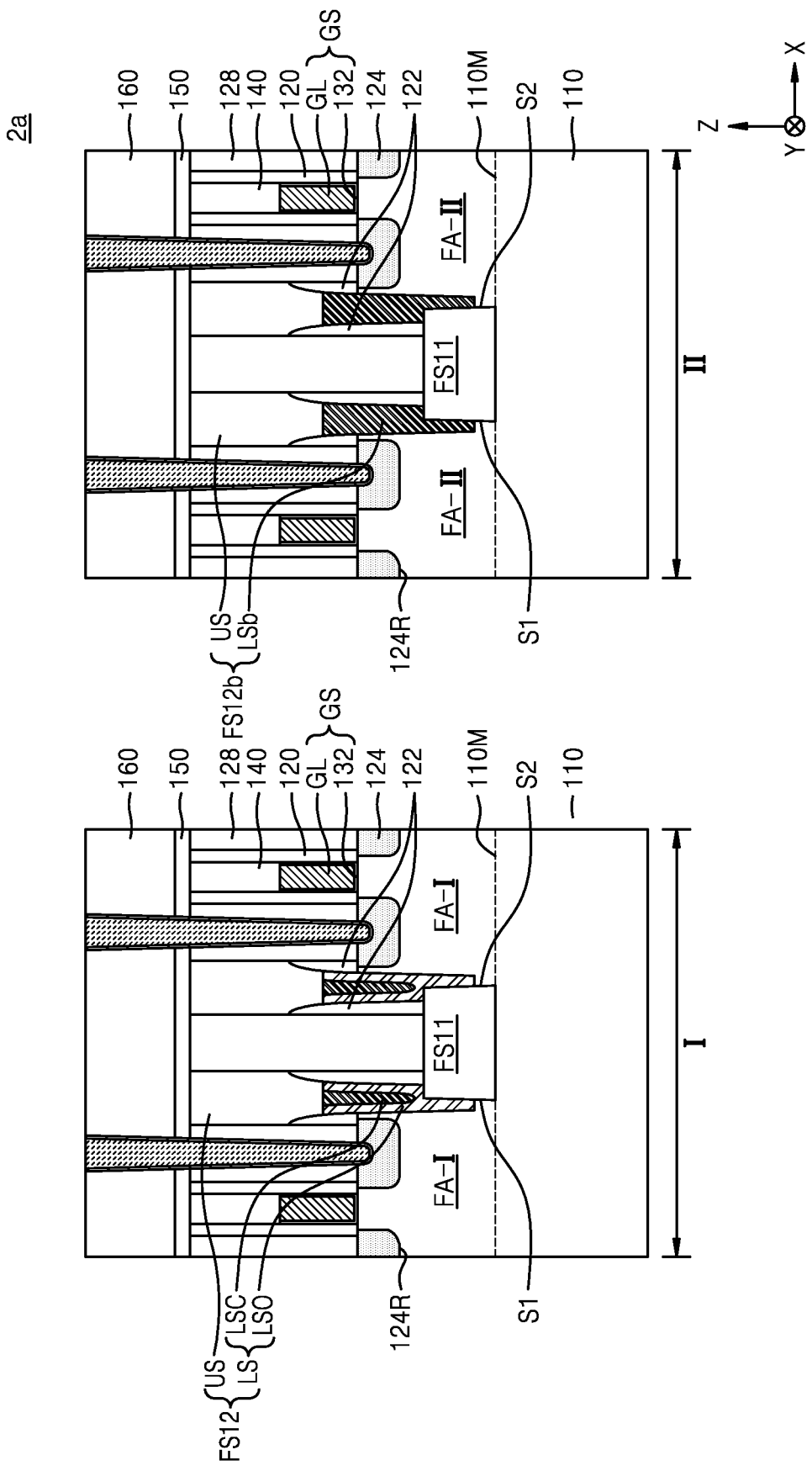
Figure 23C:
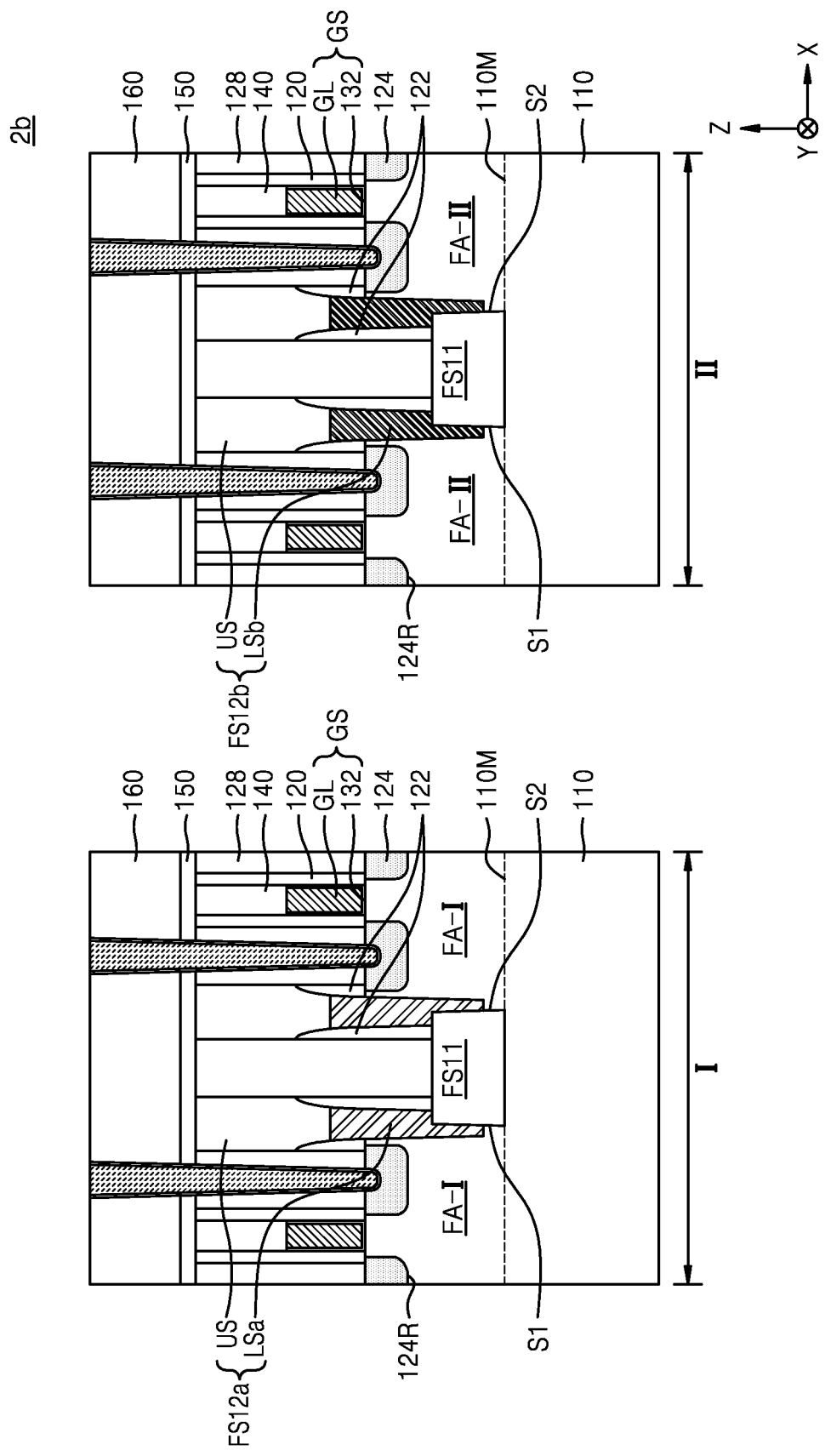

FIGS. 23A through 23C are cross-sectional views for describing integrated circuit devices 2, 2a, and 2b according to embodiments. Like reference numerals in FIGS. 1 through 2B refer to like elements in FIGS. 23A through 23C, and thus, their detailed descriptions will be omitted.

Referring to FIG. 23A, the integrated circuit device 2 may have the first region I and the second region II.

At least a portion of the second fin-isolation insulating portion FS12 in the first region I and at least a portion of the second fin-isolation insulating portion FS12a in the second region II may have a different material from each other. The second fin-isolation insulating portion FS12 in the first region I may include the lower fin-isolation insulating portion LS and the upper fin-isolation insulating portion US located on the lower fin-isolation insulating portion LS, and the second fin-isolation insulating portion FS12a in the second region II may include the lower fin-isolation insulating portion LSa and the upper fin-isolation insulating portion US located on the lower fin-isolation insulating portion LSa.

In some embodiments, the upper fin-isolation insulating portion US formed in each of the first region I and the second region II may include an oxide layer.

The lower fin-isolation insulating portion LS formed in the first region I may include the core insulating pattern LSC and the peripheral insulating pattern LSO covering side surfaces and a bottom surface of the core insulating pattern LSC. The core insulating pattern LSC and the peripheral insulating pattern LSO formed in the first region I may include a different material from each other. In some embodiments, the peripheral insulating pattern LSO may include a nitride layer and the core insulating pattern LSC may include an oxide layer.

The lower fin-isolation insulating portion LSa formed in the second region II may include the same material as the peripheral insulating pattern LSO formed in the first region I. In some embodiments, the peripheral insulating pattern LSO formed in the first region I and the lower fin-isolation insulating portion LSa formed in the second region II may include a nitride layer.

According to the integrated circuit device 2, at least a portion of the second fin-isolation insulating portion FS12 in the first region I and at least a portion of the second fin-isolation insulating portion FS12a in the second region II may have a different material from each other. Thus, the integrated circuit device 2 may separately and finely control the characteristics of the MOS transistors formed in the first region I and the MOS transistors formed in the second region II, and thus, may provide improved or optimum performance.

Referring to FIG. 23B, the integrated circuit device 2a may have the first region I and the second region II. At least a portion of the second fin-isolation insulating portion FS12 in the first region I and at least a portion of the second fin-isolation insulating portion FS12b in the second region II may have a different material from each other.

The second fin-isolation insulating portion FS12 in the first region I may include the lower fin-isolation insulating portion LS and the upper fin-isolation insulating portion US located on the lower fin-isolation insulating portion LS, and the second fin-isolation insulating portion FS12b in the second region II may include the lower fin-isolation insulating portion LSb and the upper fin-isolation insulating portion US located on the lower fin-isolation insulating portion LSb.

In some embodiments, the upper fin-isolation insulating portion US formed in each of the first region I and the second region II may include an oxide layer.

The lower fin-isolation insulating portion LS formed in the first region I may include the core insulating pattern LSC and the peripheral insulating pattern LSO covering side surfaces and a bottom surface of the core insulating pattern LSC.

The lower fin-isolation insulating portion LSb formed in the second region II may include the same material as the core insulating pattern LSC formed in the first region I. In some embodiments, the core insulating pattern LSC formed in the first region I and the lower fin-isolation insulating portion LSb formed in the second region II may include an oxide layer.

According to the integrated circuit device 2a, at least a portion of the second fin-isolation insulating portion FS12 in the first region I and at least a portion of the second fin-isolation insulating portion FS12b in the second region II may have a different material from each other. Thus, the integrated circuit device 2a may separately and finely control the characteristics of the MOS transistors formed in the first region I and the MOS transistors formed in the second region II, and thus, may provide improved or optimum performance.

Referring to FIG. 23C, the integrated circuit device 2b may have the first region I and the second region II. At least a portion of the second fin-isolation insulating portion FS12a in the first region I and at least a portion of the second fin-isolation insulating portion FS12b in the second region II may have a different material from each other.

The second fin-isolation insulating portion FS12a in the first region I may include the lower fin-isolation insulating portion LSa and the upper fin-isolation insulating portion US located on the lower fin-isolation insulating portion LSa, and the second fin-isolation insulating portion FS12b in the second region II may include the lower fin-isolation insulating portion LSb and the upper fin-isolation insulating portion US located on the lower fin-isolation insulating portion LSb.

In some embodiments, the upper fin-isolation insulating portion US formed in each of the first region I and the second region II may include an oxide layer.

The lower fin-isolation insulating portion LSa formed in the first region I and the lower fin-isolation insulating portion LSb formed in the second region II may include a different material from each other. In some embodiments, the lower fin-isolation insulating portion LSa formed in the first region I may include a nitride layer and the lower fin-isolation insulating portion LSb formed in the second region II may include an oxide layer.

According to the integrated circuit device 2b, at least a portion of the second fin-isolation insulating portion FS12a in the first region I and at least a portion of the second fin-isolation insulating portion FS12b in the second region II may have a different material from each other. Thus, the integrated circuit device 2b may separately and finely control the characteristics of the MOS transistors formed in the first region I and the MOS transistors formed in the second region II, and thus, may provide improved or optimum performance.

While the inventive concepts have been particularly shown and described with reference to embodiments thereof, it will be understood that various changes in form and details may be made therein without departing from the spirit and scope of the following claims.

What is claimed is:

1. An integrated circuit device comprising:
   a substrate having an element region;
   a first fin-isolation insulating portion on the element region, the first fin-isolation insulating portion having two sidewalls and having a first width in a first direction;
   one or more second fin-isolation insulating portions adjacent to at least one of the two side walls of the first fin-isolation insulating portion, each of the two side walls facing the opposite side in the first direction, the one or more second fin-isolation insulating portions extending in a second direction crossing the first direction and having a second width that is less than the first width in the first direction;
   a pair of fin-type active regions spaced apart from each other in the element region with the first fin-isolation insulating portion and the one or more second fin-isolation insulating portions therebetween, and extending in a straight line in the first direction; and
   a plurality of gate structures extending in the second direction and comprising a plurality of dummy gate structures, and
   wherein a pair of dummy gate structures from among the plurality of dummy gate structures extend in a straight line in the second direction with the one or more second fin-isolation insulating portions therebetween, wherein
   a vertical level of an uppermost surface of the pair of fin-type active regions is higher than a vertical level of an uppermost surface of the first fin-isolation insulating portion and lower than a vertical level of an uppermost surface of the one or more second fin-isolation insulating portions.

2. The integrated circuit device of claim 1, wherein a width of at least a portion of the one or more second fin-isolation insulating portions in the first direction is greater than a width of the plurality of gate structures.

3. The integrated circuit device of claim 1, wherein the one or more second fin-isolation insulating portions comprise a lower fin-isolation insulating portion and an upper fin-isolation insulating portion on the lower fin-isolation insulating portion,
   wherein the lower fin-isolation insulating portion and the upper fin-isolation insulating portion are aligned in a vertical direction with respect to each other, and at least a portion of the lower fin-isolation insulating portion and at least a portion of the upper fin-isolation insulating portion have a different material from each other.

4. The integrated circuit device of claim 3, wherein a width of at least a portion of the upper fin-isolation insulating portion is greater than a width of the plurality of gate structures, and a width of the lower fin-isolation insulating portion is equal to or less than the width of the plurality of gate structures, in the first direction.

5. The integrated circuit device of claim 3, wherein the lower fin-isolation insulating portion comprises a core insulating pattern and a peripheral insulating pattern covering side surfaces and a bottom surface of the core insulating pattern, the core insulating pattern and the peripheral insulating pattern comprising a different material from each other.

6. The integrated circuit device of claim 1, further comprising:
a pair of first insulating spacers covering the two side walls of the plurality of gate structures; and
a pair of second insulating spacers covering the two side walls of the one or more second fin-isolation insulating portions,
wherein a vertical level of an uppermost surface of the pair of second insulating spacers is lower than a vertical level of an uppermost surface of the pair of first insulating spacers.

7. The integrated circuit device of claim 6, wherein the pair of second insulating spacers covering the two side walls of the one or more second fin-isolation insulating portions have a different height from each other.

8. The integrated circuit device of claim 7, wherein a height of a second insulating spacer of the pair of second insulating spacers, which vertically overlaps the first fin-isolation insulating portion, is greater than a height of a second insulating spacer of the pair of second insulating spacers, which does not vertically overlap the first fin-isolation insulating portion.

9. The integrated circuit device of claim 1, wherein the one or more second fin-isolation insulating portions comprise a pair of second fin-isolation insulating portions contacting the two side walls of the first fin-isolation insulating portion, respectively.

10. The integrated circuit device of claim 1, wherein the one or more second fin-isolation insulating portions contact only one of the two side walls of the first fin-isolation insulating portion.

11. The integrated circuit device of claim 1, wherein a vertical level of an uppermost surface of the one or more second fin-isolation insulating portions is higher than a vertical level of an uppermost surface of the plurality of gate structures, and a vertical level of a lowermost surface of the one or more second fin-isolation insulating portions is lower than a vertical level of a lowermost surface of the first fin-isolation insulating portion.

12. The integrated circuit device of claim 1, wherein one of the pair of dummy gate structures from among the plurality of dummy gate structures vertically overlaps a portion of the first fin-isolation insulating portion.

13. An integrated circuit device comprising:
a substrate having a first region and a second region;
a first fin-isolation insulating portion in each of the first region and the second region and having a first width in a first direction;
a pair of fin-type active regions spaced apart from each other in each of the first region and the second region with the first fin-isolation insulating portion therebetween, and extending in a straight line in the first direction;
one or more second fin-isolation insulating portions vertically overlapping a portion of the first fin-isolation insulating portion in at least one of the first region and the second region, extending in a second direction crossing the first direction, and having a second width that is less than the first width in the first direction; and
a plurality of gate structures extending in the second direction and comprising a plurality of dummy gate structures,
wherein a pair of dummy gate structures from among the plurality of dummy gate structures extend in a straight line in the second direction with one second fin-isolation insulating portion therebetween, and one or more dummy gate structures from among the plurality of dummy gate structures, except the pair of dummy gate structures, vertically overlap a portion of the first fin-isolation insulating portion in the second region.

14. The integrated circuit device of claim 13, wherein the one or more second fin-isolation insulating portions comprise a pair of second fin-isolation insulating portions contacting the two side walls of the first fin-isolation insulating portion in the first region, respectively, each of the two side walls facing the opposite sides in the first direction.

15. The integrated circuit device of claim 14, wherein the one or more second fin-isolation insulating portions further comprise a second fin-isolation insulating portion vertically overlapping a portion of the first fin-isolation insulating portion in the second region.

16. The integrated circuit device of claim 13, wherein the one or more dummy gate structures vertically overlapping the portion of the first fin-isolation insulating portion in the second region comprise a pair of dummy gate structures contacting the two side walls of the first fin-isolation insulating portion in the second region.

17. The integrated circuit device of claim 13, wherein the one or more second fin-isolation insulating portions comprise a lower fin-isolation insulating portion and an upper fin-isolation insulating portion on the lower fin-isolation insulating portion, wherein the lower fin-isolation insulating portion and the upper fin-isolation insulating portion are aligned in a vertical direction with respect to each other, and at least a portion of the lower fin-isolation insulating portion and at least a portion of the upper fin-isolation insulating portion have a different material from each other, and
a vertical level of an uppermost surface of the lower fin-isolation insulating portion is higher than a vertical level of an uppermost surface of the first fin-isolation insulating portion, and a vertical level of a lowermost surface of the lower fin-isolation insulating portion is lower than a vertical level of an uppermost surface of the pair of fin-type active regions.

18. The integrated circuit device of claim 17, wherein the lower fin-isolation insulating portion comprises a core insulating pattern comprising an oxide layer and a peripheral insulating pattern comprising a nitride layer and covering side surfaces and a bottom surface of the core insulating pattern.

19. An integrated circuit device comprising:
a substrate having a first region and a second region;
a first fin-isolation insulating portion in each of the first region and the second region and having a first width in a first direction;
a pair of fin-type active regions spaced apart from each other in each of the first region and the second region with the first fin-isolation insulating portion therebetween, and extending in a straight line in the first direction;

a pair of second fin-isolation insulating portions contacting, in each of the first region and the second region, the two side walls of the first fin-isolation insulating portion, respectively, each of the two side walls facing the opposite sides in the first direction; and a plurality of gate structures extending in a second direction and comprising a plurality of dummy gate structures, wherein at least a portion of the pair of second fin-isolation insulating portions in the first region and at least a portion of the pair of second fin-isolation insulating portions in the second region have a different material from each other.

20. The integrated circuit device of claim 19, wherein the pair of second fin-isolation insulating portions in each of the first region and the second region comprise a lower fin-isolation insulating portion and an upper fin-isolation insulating portion on the lower fin-isolation insulating portion, the lower fin-isolation insulating portion in the first region comprises a core insulating pattern and a peripheral insulating pattern covering side surfaces and a bottom surface of the core insulating pattern, the core insulating pattern and the peripheral insulating pattern comprising a different material from each other, and the lower fin-isolation insulating portion in the second region comprises a single material.

* * * * *